United States Patent
Sasaki et al.

(10) Patent No.: US 9,644,265 B2
(45) Date of Patent: May 9, 2017

(54) METHOD OF MANUFACTURING SEMICONDUCTOR DEVICE, SUBSTRATE PROCESSING APPARATUS AND NON-TRANSITORY COMPUTER READABLE RECORDING MEDIUM

(71) Applicant: Hitachi Kokusai Electric Inc., Tokyo (JP)

(72) Inventors: Takafumi Sasaki, Toyama (JP); Tetsuo Yamamoto, Toyama (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 156 days.

(21) Appl. No.: 14/503,707

(22) Filed: Oct. 1, 2014

(65) Prior Publication Data

US 2015/0184288 A1 Jul. 2, 2015

(30) Foreign Application Priority Data

Dec. 27, 2013 (JP) .................................. 2013-270652

(51) Int. Cl.
*C23C 16/44* (2006.01)
*C23C 16/52* (2006.01)
(Continued)

(52) U.S. Cl.
CPC .......... *C23C 16/4401* (2013.01); *C23C 16/34* (2013.01); *C23C 16/4408* (2013.01);
(Continued)

(58) Field of Classification Search
CPC ........... H01J 37/32862; C23C 16/4401; C23C 16/4404

See application file for complete search history.

(56) References Cited

U.S. PATENT DOCUMENTS

2005/0208217 A1 9/2005 Shinriki et al.
2007/0259532 A1* 11/2007 Suzaki ................ C23C 16/4401
438/758
(Continued)

FOREIGN PATENT DOCUMENTS

JP 2005-072490 A 3/2005
JP 2005113268 4/2005
(Continued)

OTHER PUBLICATIONS

English language translation of Office Action in corresponding Japanese Application No. 2013-270652, dated Apr. 30, 2015.

*Primary Examiner* — Daniel Whalen
*Assistant Examiner* — Suberr Chi
(74) *Attorney, Agent, or Firm* — Edell, Shapiro & Finnan LLC

(57) ABSTRACT

Provided are a method of manufacturing semiconductor device, a substrate processing apparatus and a recording medium which are capable of efficiently removing a deposited film in a shower head and suppressing generation of particles. The method of manufacturing a semiconductor device includes (a) forming a film on a substrate by supplying a film forming gas and an inert gas to the substrate in a processing chamber via a shower head, and (b) removing a deposited film deposited in the shower head in (a) by supplying to the shower head an inert gas, which has a temperature lower than that of the inert gas supplied in (a), into the shower head without the substrate loaded in the processing chamber.

20 Claims, 8 Drawing Sheets

(51) Int. Cl.
  *C23C 16/455* (2006.01)
  *H01L 21/02* (2006.01)
  *C23C 16/34* (2006.01)
  *H01J 37/32* (2006.01)

(52) U.S. Cl.
  CPC ...... *C23C 16/4412* (2013.01); *C23C 16/4557* (2013.01); *C23C 16/45542* (2013.01); *C23C 16/45565* (2013.01); *C23C 16/52* (2013.01); *H01J 37/3244* (2013.01); *H01J 37/32449* (2013.01); *H01J 37/32522* (2013.01); *H01J 37/32834* (2013.01); *H01J 37/32853* (2013.01); *H01J 37/32862* (2013.01); *H01L 21/0262* (2013.01)

(56) References Cited

U.S. PATENT DOCUMENTS

| | | | |
|---|---|---|---|
| 2011/0065276 A1* | 3/2011 | Ganguly | H01L 21/0223 438/694 |
| 2013/0260566 A1* | 10/2013 | Yamazaki | 438/706 |
| 2016/0042943 A1* | 2/2016 | Ribaudo | H01J 37/32357 438/725 |

FOREIGN PATENT DOCUMENTS

| | | |
|---|---|---|
| JP | 2008-288281 A | 11/2008 |
| JP | 2010-287705 A | 12/2010 |
| JP | 2011-066106 A | 3/2011 |
| WO | 2005029566 | 3/2005 |

* cited by examiner

METHOD OF MANUFACTURING SEMICONDUCTOR DEVICE, SUBSTRATE PROCESSING APPARATUS AND NON-TRANSITORY COMPUTER READABLE RECORDING MEDIUM

CROSS-REFERENCE TO RELATED PATENT APPLICATION

This application claims foreign priority under 35 U.S.C. §119(a)-(d) to Application No. JP 2013-270652 filed on Dec. 27, 2013, entitled "Method of Manufacturing Semiconductor Device, Substrate Processing Apparatus and Non-Transitory Computer-Readable Recording Medium," the entire contents of which are hereby incorporated by reference.

FIELD OF THE INVENTION

The present invention relates to a semiconductor device manufacturing method including a substrate processing process, a substrate processing method, and a substrate processing apparatus configured to perform a process included in the semiconductor device manufacturing method or substrate processing method.

BACKGROUND

Recently, there has been a tendency to manufacture semiconductor devices such as flash memories in a highly integrated manner. Thus, pattern sizes of semiconductor devices are becoming finer and finer. To form such a fine pattern, a predetermined treatment process, such as an oxidation process or a nitridation process, may be performed on a substrate as a process included in a semiconductor device manufacturing process.

As a method of forming such a pattern, there is a process of forming a groove between circuits and forming a liner film or wires in the groove. Such grooves are being formed to have higher aspect ratios as pattern sizes become finer and finer.

To form the liner film and the like, it is required to form a film having high step coverage such that the film has a uniform film thickness on an upper side surface, a middle side surface, a lower side surface and a bottom portion of the groove. By forming the film having high step coverage, a semiconductor device may have uniform characteristics, thereby suppressing a deviation in the characteristics of the semiconductor device.

There have been attempts to form a film in a groove having a high aspect ratio by heating a gas or converting the gas into a plasma state, but a film having high step coverage is difficult to form. As a method of forming a film having high step coverage, a method of alternately supplying at least two types of processing gases and reacting the supplied gases on a surface of a substrate to form a film has been introduced.

Since the characteristics of a semiconductor device need to be made uniform, a gas should be uniformly supplied within a plane of the substrate when a thin film is formed. To this end, for example, a single-wafer-type apparatus is used as a substrate processing apparatus capable of uniformly supplying a gas to the surface of the substrate to be processed. In the single-wafer-type apparatus, for example, a shower head configured to supply a gas to a substrate is installed to supply a gas to the substrate more uniformly and a buffer space is formed in the shower head.

When the above method is performed by a single-wafer-type apparatus including a shower head, residual processing gases should be purged (discharged) using an inert gas when each of the processing gases is not supplied so as to prevent the processing gases from reacting with each other on locations except for a surface of a substrate. However, such a purge process decreases a film forming speed. Thus, it may be effective to discharge residual gases by supplying a large amount of a purge gas in order to reduce a film forming time.

Also, according to an embodiment of the present invention, buffer spaces corresponding to various types of gases may be formed in a shower head to prevent processing gases from being mixed with each other. However, in this case, since the system has a complicated structure, maintenance is not easy and costs increase. Accordingly, it is practical to use a shower head including a common buffer space for a plurality of gases.

As described above, a common shower head may be used for a plurality of gases to uniformly supply gases and form a film at a high speed, and a purge gas may be supplied at a high flow rate to discharge residual gases. However, when the shower head is cooled by the purge gas, by-products are likely to be attached to the inside of the shower head. The attached by-products may change into particles which have a bad influence on the features of a film formed on a substrate.

SUMMARY

It is an object of the present invention to provide a technique of efficiently removing a deposited film in a shower head to suppress generation of particles.

According to one aspect of the present invention, there is provided a method of manufacturing a semiconductor device, the method including: (a) forming a film on a substrate by supplying a film forming gas and an inert gas to the substrate in a processing chamber via a shower head; and (b) removing a deposited film deposited in the shower head in (a) by supplying an inert gas, which has a temperature lower than that of the inert gas supplied in (a), into the shower head without the substrate loaded in the processing chamber.

According to another aspect of the present invention, there is provided a program causing a computer to perform: (a) forming a film on a substrate by supplying a film forming gas and an inert gas to the substrate in a processing chamber via a shower head; and (b) removing a deposited film deposited in the shower head in (a) by supplying an inert gas, which has a temperature lower than that of the inert gas supplied in (a), into the shower head without the substrate loaded in the processing chamber.

According to another aspect of the present invention, there is provided a substrate processing apparatus including: a processing chamber connected to a shower head and configured to process a substrate; a film forming gas supply system connected to the shower head and configured to supply a film forming gas into the processing chamber via the shower head; an inert gas supply system connected to the shower head and configured to supply an inert gas into the processing chamber via the shower head; a controller configured to control the film forming gas supply system and the inert gas supply system to perform: (a) forming a film on the substrate by supplying the film forming gas and the inert gas to the substrate in the processing chamber via the shower head; and (b) removing a deposited film deposited in the shower head in (a) by supplying an inert gas, which has a temperature lower than that of the inert gas supplied in (a), into the shower head without the substrate loaded in the processing chamber.

DETAILED DESCRIPTION

First Embodiment (1) Structure of Substrate Processing Apparatus

Figure 1:
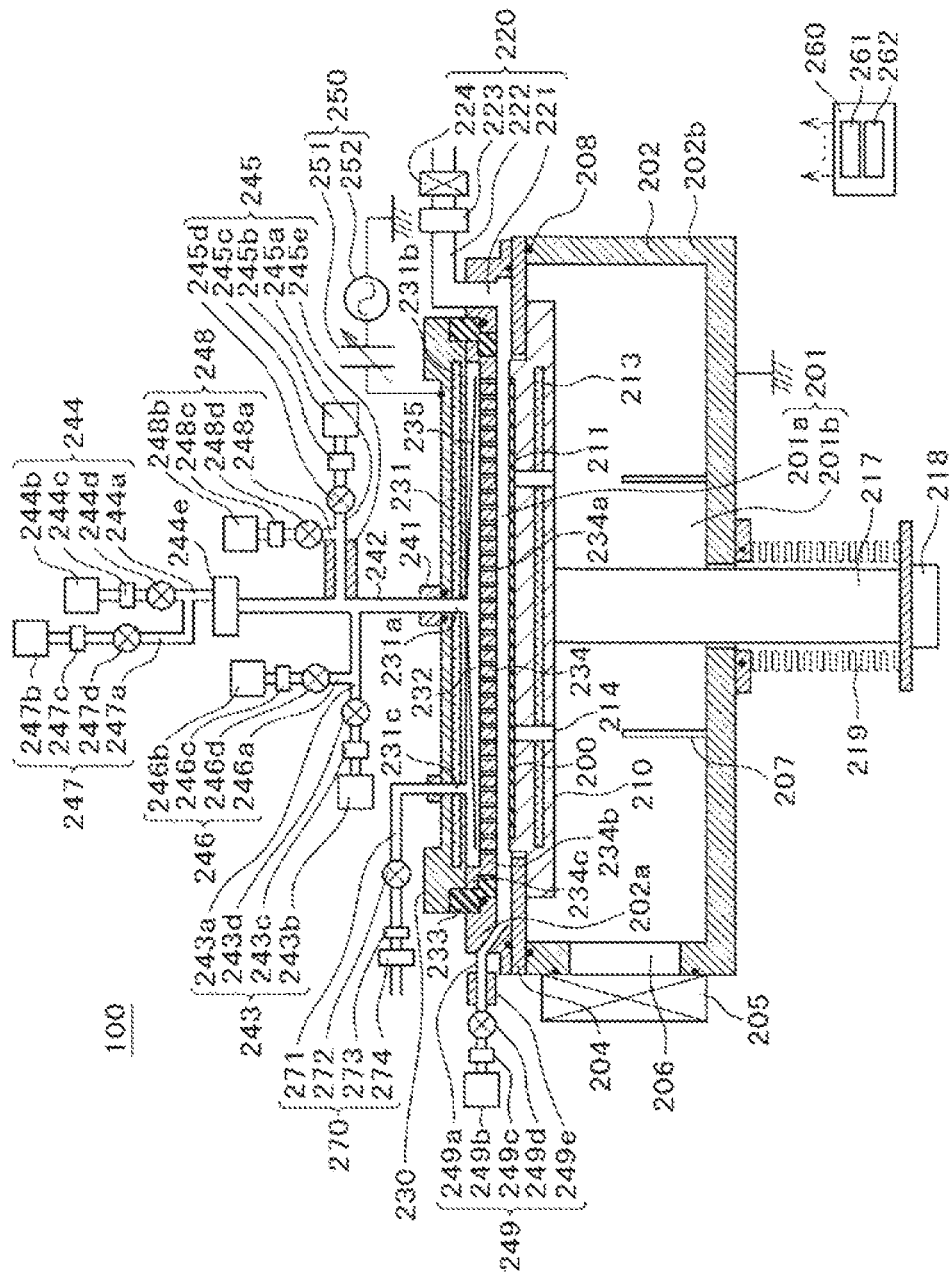
FIG. 1 is a schematic longitudinal cross-sectional view of a substrate processing apparatus according to a first embodiment of the present invention.

First, the structure of a substrate processing apparatus 100 (which may be also referred to simply as an 'apparatus') according to a first embodiment of the present invention will be described with reference to FIG. 1. FIG. 1 is a schematic longitudinal (vertical) cross-sectional view of a substrate processing apparatus according to a first embodiment of the present invention. The substrate processing apparatus 100 is an apparatus that forms a thin film and is configured as a single-wafer-type substrate processing apparatus capable of processing one or several substrates as illustrated in FIG. 1.

As illustrated in FIG. 1, the substrate processing apparatus 100 includes a processing container 202. The processing container 202 is configured, for example, as a flat cylindrical airtight container having a circular cross-section (horizontal cross-section). In addition, sidewalls or a lower wall of the processing container 202 is formed of a metal material, e.g., aluminum (Al) or stainless steel (steel-use-stainless (SUS)).

In the processing container 202, a processing chamber 201 configured to process a wafer 200 serving as a substrate, e.g., a silicon wafer, is formed. The processing chamber 201 includes a processing space 201a for processing the wafer 200 and a transfer space 201b for transferring the wafer 200. The exterior of the processing container 202 is configured by an upper container 202a, a lower container 202b and a shower head 230 which is a ceiling portion. A partition plate 204 is installed between the upper container 202a and the lower container 202b to differentiate the processing space 201a and the transfer space 201b.

The processing space 201a is a space surrounded by the upper container 202a, the shower head 230 and a substrate placing unit 210 which will be described below, and disposed above the partition plate 204. The transfer space 201b is a space surrounded by the lower container 202b and the substrate placing unit 210, and disposed below the partition plate 204. In order to airtightly close the inside atmosphere of the processing container 202, an O-ring 208 is installed between the upper container 202a and the partition plate 204 (an interface between the upper container 202a and the partition plate 204) or between the partition plate 204 and the lower container 202b (an interface between the partition plate 204 and the lower container 202b).

At a side of the lower container 202b, a substrate loading exit 206 is installed adjacent to a gate valve 205. The wafer 200 is moved between adjacent substrate transfer chambers (not shown) via the substrate loading exit 206. A plurality of lift pins 207 are vertically installed on a bottom portion of the lower container 202b. The lower container 202b is electrically grounded.

A substrate placing unit 210 configured to support the wafer 200 is present between the processing space 201a and the transfer space 201b. The substrate placing unit 210 is formed of, for example, a non-metal material such as aluminum nitride (AlN), a ceramic, quartz, etc. The substrate placing unit 210 includes a substrate placing surface 211 on which the wafer 200 is placed, and a substrate placing unit heater 213 included as a heating source in the substrate placing unit 210. The substrate placing surface 211 is disposed in the processing space 201a. In the substrate placing unit 210, substrate placing unit through-holes 214 through which the lift pins 207 pass are installed in locations corresponding to the lift pins 207.

The substrate placing unit 210 is supported by a shaft 217. The shaft 217 vertically passes through a bottom portion of the processing container 202 and is connected to a lifting mechanism 218 outside the processing container 202. By lifting the shaft 217 and the substrate placing unit 210 by operating the lifting mechanism 218, the wafer 200 placed on the substrate placing surface 211 may be moved upward. In addition, the circumference of the shaft 217 is covered with a bellows 219 and the inside atmosphere of the processing container 202 is maintained in an airtight state.

The substrate placing unit 210 is moved downward to move the substrate placing surface 211 to the substrate loading exit 206 (i.e., a wafer transfer position) so as to transfer the wafer 200, and is moved upward to move the wafer 200 to a processing position (i.e., a wafer processing position) so as to process the wafer 200 as illustrated in FIG. 1.

In detail, when the substrate placing unit 210 is moved downward to the wafer transfer position, upper end portions of the lift pins 207 protrude from an upper surface of the substrate placing surface 211 to support the wafer 200 with the lift pins 207 from below. When the substrate placing unit 210 is moved upward to the wafer processing position, the lift pins 207 are buried below the upper surface of the substrate placing surface 211 so that the wafer 200 may be supported by the substrate placing surface 211 from below. In addition, the lift pins 207 are in direct contact with the wafer 200 and are thus preferably formed of, for example, quartz or alumina.

Gas Introduction Hole

In an upper surface (a ceiling wall) of the shower head 230 which will be described in detail below, a gas introduction hole 241 is formed to supply various gases into the processing chamber 201. The structure of a gas supply system connected to the gas introduction hole 241 will be described below.

Shower Head

The shower head 230 which is the ceiling portion of the processing chamber 201 is installed on the processing chamber 201. The gas introduction hole 241 is formed by a cover 231 of the shower head 230. The shower head 230 is a gas dispersion mechanism configured to disperse a gas in the processing chamber 201. The shower head 230 is disposed between the gas introduction hole 241 and the processing chamber 201, and communicates with the gas introduction hole 241 and the processing chamber 201.

The shower head 230 includes a dispersion plate 234 between the gas introduction hole 241 and the processing space 201a to disperse a gas introduced via the gas introduction hole 241. A plurality of through-holes 234a are formed in the dispersion plate 234. The through-holes 234a are disposed opposite the substrate placing surface 211. The gas dispersion plate 234 includes a convex part 234b having the through-holes 234a and a flange part 234c installed around the convex part 234b. The flange part 234c is supported by an insulating block 233 which is an electrically insulating structure.

In the shower head 230, a buffer chamber 232 which is a buffer space for spreading a gas introduced via the gas introduction hole 241 to an entire surface of the dispersion plate 234 is installed between the cover 231 and the dispersion plate 234.

In the buffer chamber 232, a gas guide 235 is installed to form the flow of a gas supplied into the buffer chamber 232. The gas guide 235 has a conical shape, the peak point of which is a cover hole 231a formed in the cover 231 to communicate with the gas introduction hole 241, and the diameter of which increases in a direction of the dispersion plate 234 (i.e., in a downward direction). A horizontal diameter of a lower end of the gas guide 235 is greater than a diameter of an outermost circumferential portion of a group of the through-holes 234a. A gas supplied into the buffer chamber 232 by the gas guide 235 is dispersed uniformly.

The gas introduced via the gas introduction hole 241 as described above is supplied into the buffer chamber 232 installed in the shower head 230 via the cover hole 231a of the cover 231. Then, the gas is uniformly dispersed by the dispersion plate 234 and the gas guide 235 and supplied into the processing chamber 201 via the through-holes 234a of the dispersion plate 234.

The cover 231 of the shower head 230 is formed of a conductive metal and is used as an electrode to generate plasma in the buffer chamber 232 or the processing chamber 201. The insulating block 233 is installed between the cover 231 and the upper container 202a to electrically insulate the cover 231 and the upper container 202a from each other. A resistance heater 231b which is a shower head heating unit is installed at the cover 231.

At the cover 231 above the buffer chamber 232, a second exhaust system (shower head exhaust line) 270 is installed to exhaust an inside atmosphere of the buffer chamber 232. The second exhaust system 270 will be described below.

Gas Supply System

A common gas supply pipe 242 is connected to the gas introduction hole 241 connected to the cover 231 of the shower head 230. A first gas supply pipe 243a, a second gas supply pipe 244a and a third gas supply pipe 245a are connected to the common gas supply pipe 242. The second gas supply pipe 244a is connected to the common gas supply pipe 242 via a remote plasma unit 244e.

A first-element containing gas is mainly supplied via a first gas supply system 243 including the first gas supply pipe 243a and a second-element containing gas is mainly supplied via a second gas supply system 244 including the second gas supply pipe 244a. An inert gas is mainly supplied using a third gas supply system 245 including the third gas supply pipe 245a when the wafer 200 is processed, and a cleaning gas is mainly supplied when the shower head 230 or the processing chamber 201 is cleaned.

First Gas Supply System

At the first gas supply pipe 243a, a first gas source 243b, a mass flow controller (MFC) 243c which is a flow rate controller (flow rate control unit) and a valve 243d which is an opening/closing valve are sequentially installed from a direction of upstream gas flow.

A gas containing a first element (hereinafter referred to as the 'first-element containing gas') is supplied into the shower head 230 via the MFC 243c, the valve 243d and the common gas supply pipe 242.

The first-element containing gas is a source gas, i.e., one of the processing gases. Here, the first element is, for example, titanium (Ti). That is, the first-element containing gas is, for example, a titanium-containing gas. For example, TiCl4 (titanium tetrachloride) gas may be used as the titanium-containing gas. In addition, the first-element containing gas may have a solid, liquid, or gaseous state at normal temperature and pressure. When the first-element containing gas has a liquid state at normal temperature and pressure, a vaporizer (not shown) may be installed between the first gas source 243b and the MFC 243c. Here, it is assumed that the first-element containing gas is in a gaseous state.

For example, organic silicon materials such as bis-tertiary butyl aminosilane (SiH2[NH(C4H9)]2, abbreviated as 'BTBAS') gas, hexamethyldisilazane (C6H19NSi2, abbreviated as 'HMDS'), trisilylamine [(SiH3)3N, abbreviated as 'TSA'], or the like may be used as the first-element containing gas. These gases act as precursors.

A downstream end of a first inert gas supply pipe 246a is connected to the first gas supply pipe 243a downstream from the valve 243d. An inert gas source 246b, an MFC 246c which is a flow rate controller (flow rate control unit) and a valve 246d which is an opening/closing valve are sequentially installed at the first inert gas supply pipe 246a from the upstream end.

An inert gas supplied from the first inert gas supply pipe 246a is, for example, nitrogen (N2) gas. In addition to the N2 gas, for example, a rare gas such as helium (He) gas, neon (Ne) gas, or argon (Ar) gas may be used as the inert gas.

The inert gas is supplied into the shower head 230 from the first inert gas supply pipe 246a via the MFC 246c, the valve 246d and the first gas supply pipe 243a. The inert gas acts as a carrier gas or a dilution gas in a film forming process (operation S104) which will be described below.

The first-element containing gas supply system 243 (which may also be referred to as a titanium-containing gas supply system) mainly includes the first gas supply pipe 243a, the MFC 243c and the valve 243d.

A first inert gas supply system 246 mainly includes the first inert gas supply pipe 246a, the MFC 246c and the valve 246d. The first inert gas supply system 246 may further include the inert gas source 246b and the first gas supply pipe 243a.

The first-element containing gas supply system 243 may further include the first gas source 243b and the first inert gas supply system 246.

Second Gas Supply System

The remote plasma unit 244e is installed downstream from the second gas supply pipe 244a. A second gas source 244b, an MFC 244c which is a flow rate controller (flow rate control unit) and a valve 244d which is an opening/closing valve are sequentially installed at the second gas supply pipe 244a from an upstream direction.

A gas containing a second element (hereinafter referred to as the 'second-element containing gas') is supplied into the shower head 230 from the second gas supply pipe 244a via the MFC 244c, the valve 244d, the remote plasma unit 244e and the common gas supply pipe 242. The second-element containing gas is changed into a plasma state by the remote plasma unit 244e and is radiated onto the wafer 200.

The second-element containing gas is one of the processing gases. In addition, the second-element containing gas may be considered as a reactive gas or a modifying gas.

Here, the second-element containing gas contains the second element that is different from the first element. The second element is, for example, nitrogen (N). In the present embodiment, it is assumed that the second-element containing gas is, for example, a nitrogen-containing gas. Specifically, ammonia (NH3) gas is used as the nitrogen-containing gas.

A second-element containing gas supply system 244 (which is the second gas supply system 244 and may also be referred to as a nitrogen-containing gas supply system) mainly includes the second gas supply pipe 244a, the MFC 244c and the valve 244d.

A downstream end of a second inert gas supply pipe 247a is connected to the second gas supply pipe 244a downstream from the valve 244d. An inert gas source 247b, an MFC 247c which is a flow rate controller (flow rate control unit) and a valve 247d which is an opening/closing valve are sequentially installed at the second inert gas supply pipe 247a from an upstream direction.

An inert gas is supplied into the shower head 230 from the second inert gas supply pipe 247a via the MFC 247c, the valve 247d and the second gas supply pipe 244a. The inert gas acts as a carrier gas or a dilution gas in the film forming process (operation S104) which will be described below.

An inert gas supplied from the second inert gas supply pipe 247a is, for example, nitrogen (N2) gas. In addition to the N2 gas, for example, a rare gas such as helium (He) gas, neon (Ne) gas, or argon (Ar) gas may be used as the inert gas.

A second inert gas supply system 247 mainly includes the second inert gas supply pipe 247a, the MFC 247c and the valve 247d. The second inert gas supply system 247 may further include the inert gas source 247b, the second gas supply pipe 244a and the remote plasma unit 244e.

The second-element containing gas supply system 244 may further include the second gas source 244b, the remote plasma unit 244e and the second inert gas supply system 247.

Third Gas Supply System

A third gas supply source 245b, an MFC 245c which is a flow rate controller (flow rate control unit), a valve 245d which is an opening/closing valve and a pipe heating unit 245e which is a gas heating unit for heating a purge gas are sequentially installed at the third gas supply pipe 245a from an upstream direction.

For example, an inert gas serving as a purge gas is supplied into the shower head 230 from the third gas supply source 245b via the MFC 245c, the valve 245d and the common gas supply pipe 242. The purge gas means a gas introduced into the processing chamber 201 or the buffer chamber 232 to exhaust an inside atmosphere (a gas) of the processing chamber 201 or the buffer chamber 232.

The inert gas supplied from the third gas supply source 245b is, for example, nitrogen (N2) gas. In addition to the N2 gas, for example, a rare gas such as helium (He) gas, neon (Ne) gas, or argon (Ar) gas may be used as the inert gas.

A purge gas heated by the pipe heating unit 245e is supplied into the processing chamber 201 via the buffer chamber 232 and the dispersion plate 234, thereby maintaining the dispersion plate 234 at a desired temperature.

For example, when the dispersion plate 234 is excessively cooled by the purge gas, a problem which will be described below may occur. That is, when the temperature of a gas remaining in the processing chamber 201 is less than or equal to a pyrolysis temperature, by-products may be deposited on a surface of the dispersion plate 234 opposite the wafer 200 or a temperature-related process window may not be maintained in a subsequent processing gas supply process (e.g., a first-element containing gas supply process to be performed after the second-element containing gas is supplied), thereby degrading the properties of a film to be processed in a subsequent process.

For example, when TiCl4 gas is supplied as the first-element containing gas and NH3 gas is supplied as the second-element containing gas, salt-ammoniac (NH4Cl) is generated as a by-product. When the temperature of the dispersion plate 234 is lowered to a temperature at which salt-ammoniac (NH4Cl) is attachable (e.g., 150□), the salt-ammoniac (NH4Cl) is attached to the dispersion plate 234. In addition, the above problem may be prevented from occurring by heating the purge gas as in the present embodiment.

A downstream end of a cleaning gas supply pipe 248a is connected to the third gas supply pipe 245a downstream from the valve 245d. A cleaning gas source 248b, an MFC 248c which is a flow rate controller (flow rate control unit) and a valve 248d which is an opening/closing valve are sequentially installed at the cleaning gas supply pipe 248a from an upstream direction.

The third gas supply system 245 mainly includes the third gas supply pipe 245a, the MFC 245c and the valve 245d.

A cleaning gas supply system 248 mainly includes the cleaning gas supply pipe 248a, the MFC 248c and the valve 248d. The cleaning gas supply system 248 may further include the cleaning gas source 248b and the third gas supply pipe 245a.

Also, the third gas supply source 245b and the cleaning gas supply system 248 may be further included in the third gas supply system 245.

An inert gas is supplied into the shower head 230 from the third gas supply pipe 245a via the MFC 245c, the valve 245d and the common gas supply pipe 242. In a cleaning process, a cleaning gas is supplied into the shower head 230 via the MFC 248c, the valve 248d and the common gas supply pipe 242.

The inert gas supplied from the inert gas source 246b acts as a purge gas for purging a gas remaining in the processing chamber 201 or the shower head 230 in the film forming process (operation S104) which will be described below. In addition, the inert gas may act as a carrier gas or a dilution gas of the cleaning gas in the cleaning process.

The cleaning gas supplied from the cleaning gas source 248b acts as a cleaning gas for removing by-products and the like attached to the inside of the shower head 230 or the processing chamber 201.

Here, the cleaning gas is, for example, nitrogen trifluoride (NF3) gas. In addition, for example, hydrofluoric acid (HF) gas, chlorine trifluoride (ClF3) gas, fluorine (F2) gas, or a combination thereof may be used as the cleaning gas.

Fourth Gas Supply System

A fourth gas supply system 249 is installed on a sidewall of the upper container 202a (i.e., a side direction of the processing chamber 201). At the fourth gas supply pipe 249a of the fourth gas supply system 249, a fourth gas source 249b, an MFC 249c which is a flow rate controller (flow rate control unit), a valve 249d which is an opening/closing valve, and a pipe heating unit 249e which is a gas heating unit for heating a purge gas are sequentially installed from the upstream end.

The fourth gas supply system 249 mainly includes the fourth gas supply pipe 249a, the MFC 249c and the valve 249d. The fourth gas source 249b may be also included in the fourth gas supply system 249.

An inert gas serving as a purge gas is supplied into the processing space 201a of the processing chamber 201 from the fourth gas source 249b via the MFC 249c, the valve 249d and the pipe heating unit 249e.

Here, the inert gas is, for example, nitrogen (N2) gas. In addition to the N2 gas, for example, a rare gas such as helium (He) gas, neon (Ne) gas, or argon (Ar) gas may be used as the inert gas.

In the film forming process (operation S104) which will be described below, a purge gas heated by the pipe heating unit 249e is supplied into the processing chamber 201 and then at least a portion of the purge gas is discharged using the second exhaust system 270 via the dispersion plate 234 and the buffer chamber 232. Thus, the inside atmosphere of the buffer chamber 232 may be purged within a short time, and the dispersion plate 234 may be maintained at a desired temperature, similar to the pipe heating unit 245e of the third gas supply system 245.

Also, in a deposited film removing process (operation S110) which will be described below, at least a portion of a purge gas supplied into the processing chamber 201 without being heated by the heating unit 249e is discharged using the second exhaust system 270 via the dispersion plate 234 and the buffer chamber 232. The deposited film removing process (operation S110) will be described in detail below.

First Exhaust System

An exhaust port 221 is installed on a side surface of an inner wall of the processing chamber 201 (upper container 202a) to exhaust an inside atmosphere of the processing chamber 201. The exhaust port 221 is connected to an exhaust pipe 222. In the exhaust pipe 222, a pressure adjuster 223 such as an auto pressure controller (APC) configured to control the inside of the processing chamber 201 to have a predetermined pressure and a vacuum pump 224 are sequentially connected in series according to the order of gas flow. A first exhaust system (processing chamber exhaust line) 220 is configured to include the exhaust port 221, the exhaust pipe 222 and the pressure adjuster 223. The vacuum pump 224 may be further included in the first exhaust system 220.

Second Exhaust System

A shower head exhaust hole 231c is installed while vertically passing through the cover 231 above the buffer chamber 232 to exhaust an inside atmosphere of the buffer chamber 232. An exhaust pipe 271 is connected to the shower head exhaust hole 231c. A valve 272 configured to switch exhaust ON/OFF, a pressure adjuster 273, such as an APC, configured to control the inside atmosphere of the buffer chamber 232 to have a predetermined pressure, and a vacuum pump 274 are connected in series to the exhaust pipe 271 according to the order of gas flow. The second exhaust system (shower head exhaust line) 270 is configured to include the exhaust pipe 271, the valve 272 and the pressure adjuster 273. The vacuum pump 274 may be further included in the second exhaust system 270.

The shower head exhaust hole 231c is disposed above the gas guide 235 and is thus configured such that gases flow therethrough as described below in shower head exhaust processes (operations S204 and S210) which will be described below. That is, an inert gas supplied via the cover hole 231a is dispersed by the gas guide 235 to flow through the center and bottom of a space in the buffer chamber 232. Then, the inert gas circulates through an end portion of the gas guide 235 and is exhausted via the shower head exhaust hole 231c.

Plasma Generation Unit

A high-frequency power source 252 is connected to the cover 231 of the shower head 230 via a matching device 251. Plasma is generated in the shower head 230 (particularly, in the buffer chamber 232) or in the processing chamber 201 (particularly, in the processing space 201a) by supplying high-frequency power to the cover 231 from the high-frequency power source 252 by adjusting impedance by the high-frequency power source 252 and the matching device 251.

Controller

The substrate processing apparatus 100 includes a controller 260 which is a control unit configured to control operations of various elements of the substrate processing apparatus 100. The controller 260 includes at least an arithmetic unit 261 and a memory unit 262. The arithmetic unit 261 calls a program of the substrate processing apparatus 100 or a control recipe from the memory unit 262 according to a command from the controller 260 or a user, and controls various elements of the substrate processing apparatus 100 according to the program or the control recipe.

(2) Substrate Processing Process

Figure 2:
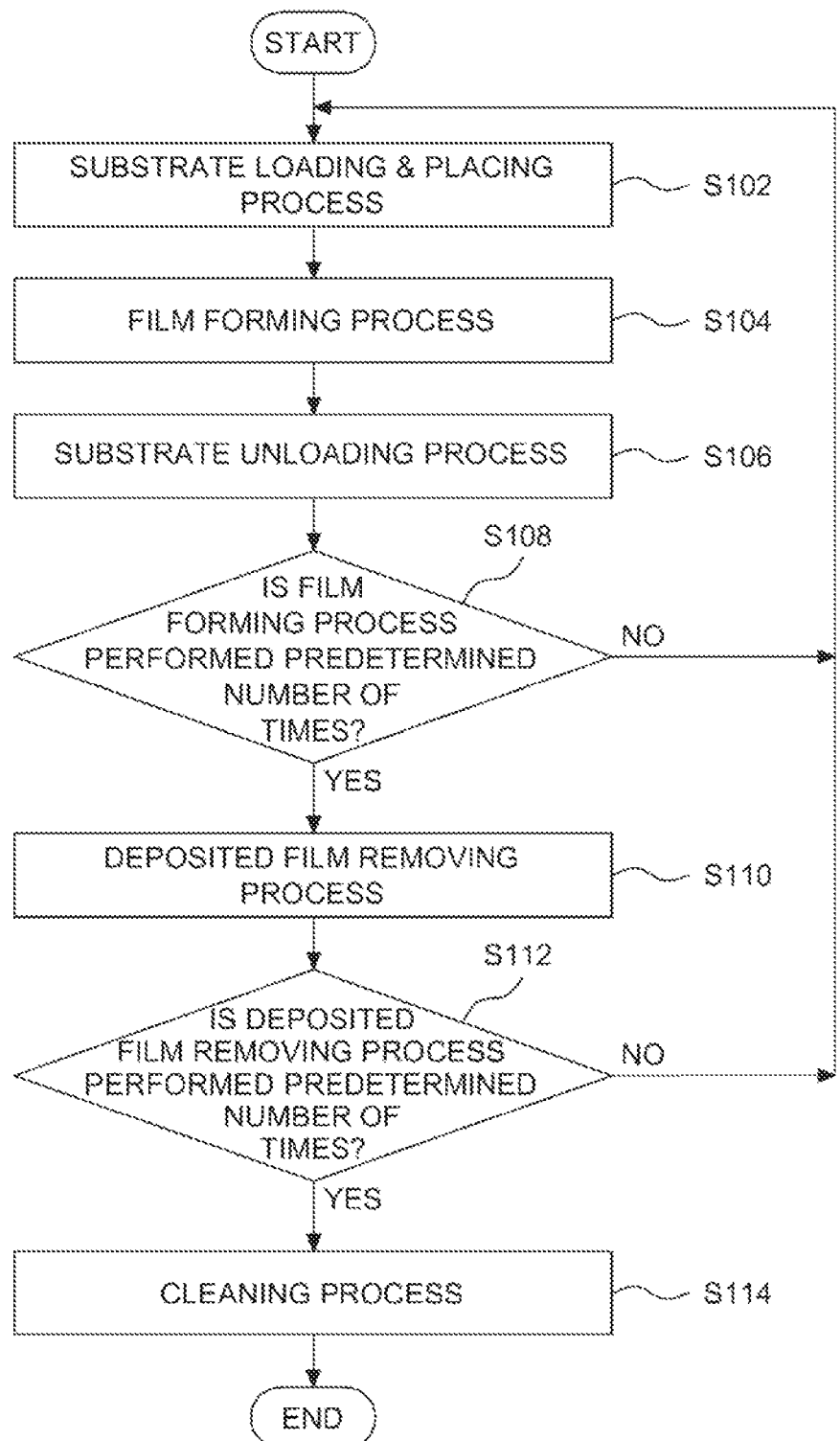
FIG. 2 is a flow chart of a substrate processing process according to the first embodiment of the present invention.

Next, a substrate processing process of processing a substrate using the substrate processing apparatus 100 as a semiconductor manufacturing apparatus will be briefly described. The substrate processing process is, for example, a process of manufacturing a semiconductor device. In the following description, the operations or processing of various elements of the substrate processing apparatus 100 is controlled by the controller 260. FIG. 2 is a flow chart of a substrate processing process according to the first embodiment of the present invention.

Here, a case in which a titanium nitride (TiN) film is formed as a thin film on the wafer 200 using titanium tetrachloride (TiCl4) gas as a first-element containing gas and ammonia (NH3) gas as a second-element-containing gas will be described. In addition, for example, a predetermined film may be formed on the wafer 200 beforehand. In addition, a predetermined pattern may be formed on the wafer 200 or the predetermined film.

Substrate Loading and Placing Process (Operation S102)

First, as illustrated in FIG. 2, a substrate loading and placing process (operation S102) of loading the wafer 200 in the processing chamber 201 and placing the wafer 200 on the substrate placing unit 210 is performed. Specifically, the substrate placing unit 210 is moved downward to a position at which the wafer 200 is to be transferred to cause the lift pins 207 to pass through the substrate placing unit through-holes 214 of the substrate placing unit 210. As a result, the lift pins 207 protrude by a predetermined height from a surface of the substrate placing unit 210. Then, the gate valve 205 is opened, and the wafer 200 (a substrate to be processed) is loaded into the processing chamber 201 using a wafer transfer machine (not shown) and transferred onto the lift pins 207. Thus, the wafer 200 is supported in a horizontal posture on the lift pins 207 protruding from the surface of the substrate placing unit 210.

After the wafer 200 is loaded into the processing container 202, the wafer transfer machine is withdrawn to the outside of the processing container 202, the gate valve 205 is closed, and the inside atmosphere of the processing container 202 is airtightly closed. Then, the wafer 200 is placed on the substrate placing surface 211 of the substrate placing unit 210 by moving the substrate placing unit 210 upward.

Also, when the wafer 200 is loaded into or unloaded from the processing container 202, an inert gas, e.g., N2 gas, is preferably supplied from the inert gas supply system into the processing container 202 while the inside atmosphere of the processing container 202 is exhausted using an exhaust system. For example, the N2 gas is preferably supplied into the processing container 202 by opening at least the valve 245d of the third gas supply system 245 in a state in which the inside atmosphere of the processing container 202 is exhausted by the first exhaust system 220 by operating the vacuum pump 224 to open the pressure adjuster 223. Thus, particles may be suppressed from penetrating into the processing container 202 via the substrate loading exit 206 or from being attached to the wafer 200. In addition, the vacuum pump 224 of the first exhaust system 220 is constantly operated at least during the time of the substrate loading and placing process (operation S102) to an end of a substrate unloading process (operation S106) which will be described below end.

When the wafer 200 is placed on the substrate placing unit 210, power is supplied to the substrate placing unit heater 213 embedded in the substrate placing unit 210 so as to control a surface of the wafer 200 to have a predetermined temperature. The temperature of the wafer 200 is, for example, in a range of room temperature to 500° C., and preferably, a range of room temperature to 400° C. The room temperature may be understood as being in a range of about 10° C. to 30° C. Here, the room temperature is 20° C. In this case, the temperature of the substrate placing unit heater 213 is adjusted by controlling the amount of electric power to be supplied to the substrate placing unit heater 213 by the controller 260, based on temperature information detected by a temperature sensor (not shown).

Film Forming Process (Operation S104)

Next, the film forming process (operation S104) of forming a thin film on the wafer 200 is performed. A basic flow of the film forming process (operation S104) will now be described, and the details of the film forming process (operation S104) will be described with reference to FIG. 3 below.

In the film forming process (operation S104), first, a titanium-containing film is formed on the wafer 200 by supplying TiCl4 gas into the processing chamber 201 from the first gas supply system 243 via the buffer chamber 232 of the shower head 230. The supply of the TiCl4 gas is suspended a predetermined time after the TiCl4 gas is supplied. Then, a purge gas (an inert gas such as N2 gas) is supplied into the processing chamber 201 via the third gas supply system 245 and the fourth gas supply system 249, and the TiCl4 gas is discharged from the inside atmosphere of the buffer chamber 232 and the inside of the processing chamber 201 using the purge gas via the first exhaust system 220 and the second exhaust system 270. In this case, when the purge gas is supplied into the processing chamber 201, the purge gas is heated to a predetermined temperature or more by the pipe heating unit 245e and the pipe heating unit 249e so that the dispersion plate 234 may not be cooled by the purge gas.

After the TiCl4 gas is discharged, ammonia (NH3) gas that is in a plasma state is supplied into the processing chamber 201 from the second gas supply system 244 via the buffer chamber 232. The ammonia (NH3) gas reacts with the titanium-containing film formed on the wafer 200 to form a titanium nitride film. After a predetermined time has elapsed, the supply of the ammonia (NH3) gas is suspended. Then, a purge gas is supplied using the third gas supply system 245 and the fourth gas supply system 249, and the ammonia (NH3) gas is discharged from the buffer chamber 232 and the processing chamber 201 using the purge gas via the first exhaust system 220 and the second exhaust system 270. In this case, when the purge gas is supplied into the processing chamber 201, the purge gas is also heated to a predetermined temperature or more by the pipe heating unit 245e and the pipe heating unit 249e so that the dispersion plate 234 may not be cooled by the purge gas.

In the film forming process (operation S104), a titanium nitride film is formed to a desired thickness by repeatedly performing the process described above. In addition, while the film forming process (operation S104) is performed, the buffer chamber 232 or the dispersion plate 234 is heated by the resistance heater 231b to prevent by-products from being attached and deposited onto inner walls of the buffer chamber 232.

Substrate Unloading Process (Operation S106)

Next, the wafer 200 on which the titanium nitride film is formed is unloaded from the processing container 202. In detail, the substrate placing unit 210 is moved downward to support the wafer 200 on the lift pins 207 protruding from the surface of the substrate placing unit 210. Then, the gate valve 205 is opened while an inert gas is supplied into the processing container 202 from the third gas supply system 245, and the wafer 200 is unloaded to the outside of the processing container 202 using the wafer transfer machine. Then, in order to end the substrate processing process, the supply of the inert gas into the processing container using third gas supply system 245 is suspended.

Process of Determining a Number of Times of Performing the Film Forming Process (Operation S108)

After the wafer 200 is unloaded, it is determined whether the number of times of performing the film forming process (operation S104) has reached a predetermined number of times. When it is determined that the number of times of performing the film forming process (operation S104) has reached the predetermined number of times, the deposited film removing process (operation S110) is performed. When it is determined that the number of times of performing the film forming process (operation S104) has not reached the predetermined number of times, the substrate loading and placing process (operation S102) is performed to start processing of a new wafer 200 that is in a waiting state.

Deposited Film Removing Process (Operation S110)

Although in the film forming process (operation S104), the buffer chamber 232 is heated to prevent by-products from being attached to an inner wall of the buffer chamber 232 or the dispersion plate 234, by-products are likely to be continuously attached to an inner wall of the buffer chamber 232 or the dispersion plate 234 as the film forming process (operation S104) is repeatedly performed. In some cases, a large amount of by-products may be attached to an inner wall of the buffer chamber 232 or the dispersion plate 234 when the film forming process (operation S104) is performed only once. In the deposited film removing process (operation S110), a deposited film generated due to by-products attached to an inner wall of the buffer chamber 232 or the dispersion plate 234 in the film forming process (operation S104) is removed. The deposited film removing process (operation S110) will be described in detail with reference to FIG. 4 below.

Process of Determining a Number of Times of Performing the Deposited Film Removing Process (Operation S112)

After the deposited film removing process (operation S110) is performed, it is determined whether the number of times of performing the deposited film removing process (operation S110) has reached a predetermined number of times. When it is determined that the number of times of performing the deposited film removing process (operation S110) has not reached the predetermined number of times, the substrate loading and placing process (operation S102) is performed to start processing of a new wafer 200 that is in a waiting state.

Cleaning Process (Operation S114)

When it is determined in the process of determining the number of times of performing the film forming process (operation S108) that the number of times of performing the film forming process (operation S104) has reached the predetermined number of times, a cleaning process (operation S114) is performed. In the cleaning process (operation S114), the valve 248d of the cleaning gas supply system 248 is opened and a cleaning gas is supplied into the processing chamber 201 via the shower head 230 in a state in which the substrate placing unit 210 is at the wafer processing position and the wafer 200 is not present on the substrate placing unit 210.

When the shower head 230 and the processing chamber 201 are filled with the cleaning gas, plasma of the cleaning gas is generated in the shower head 230 (particularly, the buffer chamber 232) and the processing chamber 201 (particularly, the processing space 201a) by performing an impedance adjustment using the matching device 251 while supplying power to the shower head 230 from the high-frequency power source 252. The generated plasma of the cleaning gas removes by-products attached to the inner walls of the shower head 230 and the processing chamber 201.

Figure 3:
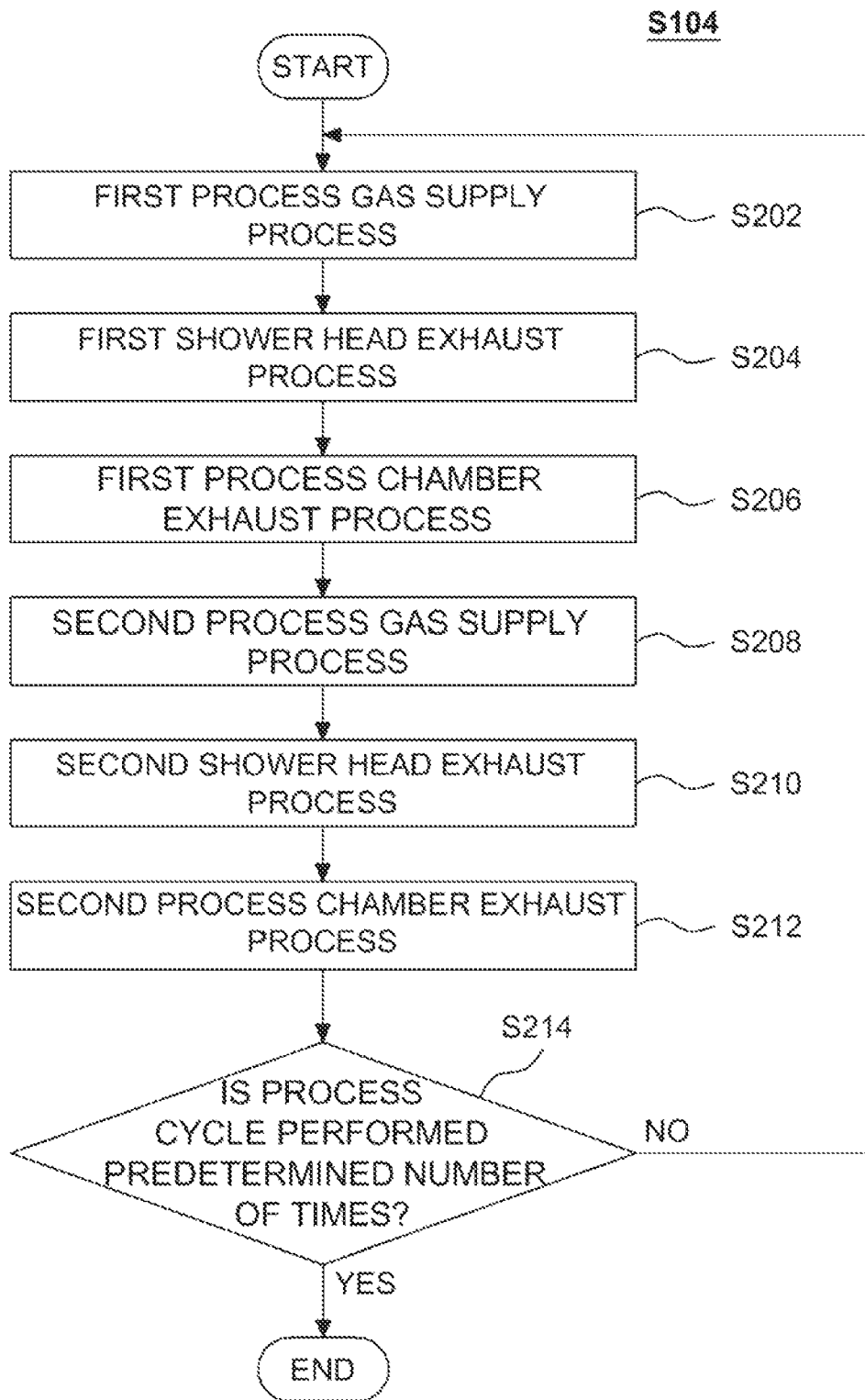
FIG. 3 is a flow chart of a film forming process according to the first embodiment of the present invention.

Next, the film forming process (operation S104) will be described in detail with reference to FIG. 3 below. FIG. 3 is a flow chart of a film forming process according to the first embodiment of the present invention.

First Processing Gas Supply Process (Operation S202)

After the wafer 200 on the substrate placing unit 210 is heated to a desired temperature by the substrate placing unit heater 213, the valve 243d of the first gas supply system 243 is opened and TiCl4 gas is started to be supplied as a first processing gas into the processing chamber 201 via the gas introduction hole 241, the buffer chamber 232 and the through-holes 234a of the dispersion plate 234 while exhausting is performed using the first exhaust system 220. In the buffer chamber 232, the TiCl4 gas is uniformly dispersed by the gas guide 235. The uniformly dispersed TiCl4 gas is uniformly supplied to the wafer 200 in the processing chamber 201 via the through-holes 234a.

In this case, a flow rate of the TiCl4 gas is adjusted to be equal to a predetermined flow rate through the MFC 243c. The supply flow rate of the TiCl4 gas is, for example, in the range of 100 sccm to 5,000 sccm. In addition, N2 gas may be supplied as a carrier gas into the processing chamber 201 together with the TiCl4 gas through the first inert gas supply system 246. In addition, a pressure in the processing container 202 is adjusted to be equal to a predetermined pressure (e.g., 10 Pa to 3,000 Pa) by appropriately adjusting the degree of openness of the pressure adjuster 223 of the first exhaust system 220.

In the processing chamber 201, the TiCl4 gas is supplied to the wafer 200 for a predetermined time, e.g., for 0.05 seconds to 0.5 seconds. A titanium-containing layer is formed as a first-element containing layer on a surface of the wafer 200 by causing the TiCl4 gas to be in contact with the surface of the wafer 200.

The titanium-containing layer is formed to a predetermined thickness and in a predetermined distribution, based on, for example, the pressure in the processing container 202, the flow rate of the TiCl4 gas, the temperature of the substrate placing unit (susceptor) 210 and the duration of a treatment performed in the processing chamber 201, etc.

After a predetermined time has elapsed, the valve 243d is closed and the supply of the TiCl4 gas is suspended. However, exhausting is continuously performed using the first exhaust system 220.

First Shower Head Exhaust Process (Operation S204)

After the supply of the TiCl4 gas is suspended, the valve 272 of the second exhaust system 270 is opened to exhaust an inside atmosphere of the shower head 230 (particularly, an inside atmosphere of the buffer chamber 232). In detail, a heated purge gas is supplied using the third gas supply system 245 and the fourth gas supply system 249, and the inside atmosphere of the buffer chamber 232 is exhausted while the temperatures of the dispersion plate 234 and the buffer chamber 232 are constantly maintained. In this case, the vacuum pump 274 is operated beforehand.

In this case, the degree of openness of the pressure adjuster 273 of the second exhaust system 270 or the pressure adjuster 223 of the first exhaust system 220 is adjusted such that an exhaust conductance in the buffer chamber 232 using the second exhaust system 270 is higher than the exhaust conductance in the buffer chamber 232 using the first exhaust system 220 via the processing chamber 201. Through the adjustment, a gas flow is formed from the center of the buffer chamber 232 toward the shower head exhaust hole 231c. Thus, a gas attached to an inner wall of the buffer chamber 232 or a gas floating in the buffer chamber 232 may be prevented from flowing into the processing chamber 201 and exhausted by the second exhaust system 270.

Also, when a purge gas is supplied using the third gas supply system 245 in the first shower head exhaust process (operation S204), a purge gas is also preferably supplied using the fourth gas supply system 249. However, the purge gas may be set to not be supplied using the fourth gas supply system 249. After the first shower head exhaust process (operation S204) is performed for a predetermined time, the first shower head exhaust process (operation S204) is discontinued.

First Processing Chamber Exhaust Process (Operation S206)

After the first shower head exhaust process (operation S204) is ended, exhausting is continuously performed by the first exhaust system 220 and the second exhaust system 270. In detail, a heated purge gas is supplied using the third gas supply system 245 and the fourth gas supply system 249, and the inside atmospheres of the buffer chamber 232 and the processing chamber 201 are exhausted while the temperatures of the dispersion plate 234 and the buffer chamber 232 are constantly maintained.

In this case, the degree of openness of the pressure adjuster 273 or the pressure adjuster 223 is adjusted such that an exhaust conductance in the processing space 201a using the first exhaust system 220 is greater than an exhaust conductance in the processing space 201a using the second exhaust system 270 via the shower head 230. Through the adjustment, a flow of an inert gas is formed toward the first exhaust system 220 from the shower head 230 via the processing chamber 201. Thus, the inert gas supplied into the buffer chamber 232 may be reliably supplied to the wafer 200, thereby increasing the efficiency of removing residual gases on wafer 200.

The inert gas supplied in the first processing chamber exhaust process (operation S206) causes a titanium component that was not combined with the wafer 200 in the first processing gas supply process (operation S202) to be removed from the wafer 200. In addition, the TiCl4 gas remaining in the shower head 230 (particularly, in the buffer chamber 232) may be removed using the second exhaust system 270 by adjusting the degree of openness of the pressure adjuster 273 or the pressure adjuster 223 in the first processing chamber exhaust process (operation S206).

After a predetermined time has elapsed after the start of the first processing chamber exhaust process (operation S206), exhaust process performed using the second exhaust system 270 is suspended by closing the valve 272. As described above, after the predetermined time has elapsed after the start of the first processing chamber exhaust process (operation S206), the exhaust process performed using the second exhaust system 270 is preferably suspended by closing the valve 272 while exhausting is performed using the first exhaust system 220. In this case, the flow of the inert gas toward the first exhaust system 220 from the shower head 230 via the processing chamber 201 is not influenced by the second exhaust system 270 and thus the inert gas may be more reliably supplied onto the wafer 200, thereby greatly increasing the efficiency of removing residual gases from the wafer 200.

Also, the exhaust process performed using the second exhaust system 270 may be suspended at the start of the first processing chamber exhaust process (operation S206). Thus, the flow of the inert gas toward the first exhaust system 220 from the shower head 230 via the processing chamber 201 may be easily formed.

The following effects may be obtained when the first processing chamber exhaust process (operation S206) is performed after the first shower head exhaust process (operation S204). That is, since residuals are removed from the inside atmosphere of the buffer chamber 232 in the first shower head exhaust process (operation S204), a residual gas may be prevented from being attached to the wafer 200 even when a gas flows onto the wafer 200 in the first processing chamber exhaust process (operation S206).

Also, when a purge gas is supplied using third gas supply system 245 in the first processing chamber exhaust process (operation S206) as described above, the purge gas may be also supplied using the fourth gas supply system 249 but may be set to not be supplied using the fourth gas supply system 249.

After the first processing chamber exhaust process (operation S206) is performed for a predetermined time, the exhaust process performed using the second exhaust system 270 is suspended by closing the valve 272 while the supply of the purge gas using the third gas supply system 245 and the fourth gas supply system 249 is suspended by closing the valve 245d and the valve 249d, and the first processing chamber exhaust process (operation S206) is ended.

Second Processing Gas Supply Process (Operation S208)

After the first processing chamber exhaust process (operation S206), the valve 244d of the second gas supply system 244 is opened and NH3 gas is started to be supplied as a second processing gas into the processing chamber 201 via the remote plasma unit 244e, the gas introduction hole 241, the buffer chamber 232 and the through-holes 234a of the dispersion plate 234 while exhausting is performed using the first exhaust system 220. The NH3 gas supplied into the processing chamber 201 is changed into a plasma state by the remote plasma unit 244e. Since the NH3 gas that is in a plasma state is supplied into the processing chamber 201 via the buffer chamber 232 and the through-holes 234a, the NH3 gas may be uniformly supplied to the wafer 200. Accordingly, a film may be formed to a uniform thickness on the wafer 200.

In this case, the flow rate of the NH3 gas is adjusted to be equal to a predetermined flow rate through the MFC 244c. The supply flow rate of the NH3 gas is, for example, in the range of 100 sccm to 5,000 sccm. In addition, N2 gas may be supplied as a carrier gas into the processing chamber 201 together with the NH3 gas through the second inert gas supply system 247. In addition, a pressure in the processing container 202 is adjusted to be equal to a predetermined pressure (e.g., 60 Pa to 600 Pa) by appropriately adjusting the degree of openness of the pressure adjuster 223 of the first exhaust system 220

In the processing chamber 201, the NH3 gas that is in the plasma state is supplied to the wafer 200 for a predetermined time, e.g., for 0.1 to 0.3 seconds. The titanium-containing layer formed on the wafer 200 is modified by the NH3 gas that is in the plasma state to form a layer containing the element titanium and the element nitrogen on the wafer 200.

The modified layer containing the element titanium and the element nitrogen is formed to have a predetermined thickness and distribution and an invasive depth of a predetermined nitrogen component or the like into the titanium containing layer, based on, for example, the pressure in the processing container 202, the flow rate of NH3 gas, the temperature of the substrate placing unit 210, the amount of electric power supplied by a plasma generation unit 250, etc.

After a predetermined time has elapsed, the supply of the NH3 gas into the processing chamber 201 is suspended by closing the valve 244d. However, exhausting is continuously performed using the first exhaust system 220.

Second Shower Head Exhaust Process (Operation S210)

After the supply of the NH3 gas is suspended, the valve 272 of the second exhaust system 270 is opened to exhaust an inside atmosphere of the shower head 230, i.e., an inside atmosphere of the buffer chamber 232. In this case, a heated purge gas is supplied using the third gas supply system 245 and the fourth gas supply system 249, and the inside atmosphere of the buffer chamber 232 is exhausted while the temperatures of the dispersion plate 234 and the buffer chamber 232 are constantly maintained.

In the second shower head exhaust process (operation S210), the degree of openness of the pressure adjuster 273 of the second exhaust system 270 or the pressure adjuster 223 of the first exhaust system 220 is adjusted such that an exhaust conductance in the buffer chamber 232 using the second exhaust system 270 is higher than the exhaust conductance in the buffer chamber 232 using the first exhaust system 220 via the processing chamber 201. Through the adjustment, a gas flow is formed from the center of the buffer chamber 232 toward the shower head exhaust hole 231c. Thus, a gas attached to an inner wall of the buffer chamber 232 or a gas floating in the buffer chamber 232 may be prevented from flowing into the processing chamber 201 and exhausted by the second exhaust system 270.

Also, when in the second shower head exhaust process (operation S210), the purge gas is supplied using the third gas supply system 245, the purge gas is also preferably supplied using the fourth gas supply system 249 as described above but also may be set to not be supplied using the fourth gas supply system 249. After the second shower head exhaust process (operation S210) is performed for a predetermined time, the second shower head exhaust process (operation S210) is ended.

Second Processing Chamber Exhaust Process (Operation S212)

After the second shower head exhaust process (operation S210), exhausting is continuously performed using the first exhaust system 220 and the second exhaust system 270. In detail, a heated purge gas is supplied using the third gas supply system 245 and the fourth gas supply system 249, and inside atmospheres of the buffer chamber 232 and the processing chamber 201 are exhausted while constantly maintaining temperatures of the dispersion plate 234 and the buffer chamber 232.

In this case, the degree of openness of the pressure adjuster 273 or the pressure adjuster 223 is adjusted such that an exhaust conductance in the processing space 201a using the first exhaust system 220 is higher than an exhaust conductance in the processing space 201a using the second exhaust system 270 via the shower head 230. Through the adjustment, a flow of a gas toward the first exhaust system 220 from the shower head 230 via the processing chamber 201 is formed. Thus, an inert gas supplied into the buffer chamber 232 may be reliably supplied to the wafer 200, thereby increasing the efficiency of removing residual gases remaining on the wafer 200.

The inert gas supplied in the second processing chamber exhaust process (operation S212) removes nitrogen components that are not combined with the wafer 200 in the second processing gas supply process (operation S208) from the wafer 200. In addition, in the second processing chamber exhaust process (operation S212), NH3 gas remaining in the shower head 230 (particularly, in the buffer chamber 232) may be removed using the second exhaust system 270 by adjusting the degree of openness of the pressure adjuster 273 or 223.

Exhaust process performed using the second exhaust system 270 is suspended by closing the valve 272 a predetermined time after the start of the second processing chamber exhaust process (operation S212). As described above, the exhaust process performed using the second exhaust system 270 is preferably suspended by closing the valve 272 the predetermined time after the start of the second processing chamber exhaust process (operation S212) while exhausting is performed using the first exhaust system 220. Accordingly, a flow of an inert gas toward the first exhaust system 220 from the shower head 230 via the processing chamber 201 is not influenced by the second exhaust system 270 and thus the inert gas may be more reliably supplied onto the wafer 200, thereby greatly increasing the efficiency of removing residual gases from the wafer 200.

When the second processing chamber exhaust process (operation S212) is performed right after the second shower head exhaust process (operation S210) as described above, the following effects may be achieved. That is, since residuals are removed from the buffer chamber 232 in the second shower head exhaust process (operation S210), a residual gas may be prevented from being attached to the wafer 200 even when a gas flows through the wafer 200 in the second processing chamber exhaust process (operation S212).

Otherwise, exhaust process performed using the second exhaust system 270 may be suspended at the start of the second processing chamber exhaust process (operation S212). Accordingly, a flow of a gas toward the first exhaust system 220 from the shower head 230 via the processing chamber 201 may be easily formed.

Also, when the purge gas is supplied using the third gas supply system 245 in the second processing chamber exhaust process (operation S212), the purge gas may be also supplied using the fourth gas supply system 249 as described above, but may be set to not be supplied using the fourth gas supply system 249.

After the second processing chamber exhaust process (operation S212) is performed for a predetermined time, the valve 272 is closed to suspend exhausting using the second exhaust system 270 while the valve 245d and the valve 249d are closed to suspend the supply of the purge gas using the third gas supply system 245 and the fourth gas supply system 249, and the second processing chamber exhaust process (operation S212) is ended.

Determination Process (Operation S214)

After the second processing chamber exhaust process (operation S212), the controller 260 determines whether one processing cycle including the first processing gas supply process (operation S202) to the second processing chamber exhaust process (operation S212) has been performed a predetermined number of times.

When it is determined that the processing cycle has not been performed the predetermined number of times ('No' in operation S214), the film forming process (operation S104) returns back to the first processing gas supply process (operation S202), and the first processing gas supply process (operation S202), the first shower head exhaust process (operation S204), the first processing chamber exhaust process (operation S206), the second processing gas supply process (operation S208), the second shower head exhaust process (operation S210) and the second processing chamber exhaust process (operation S212) are performed again. When it is determined that the processing cycle has been performed the predetermined number of times ('Yes' in operation S214), the film forming process (operation S104) is ended.

Figure 4:
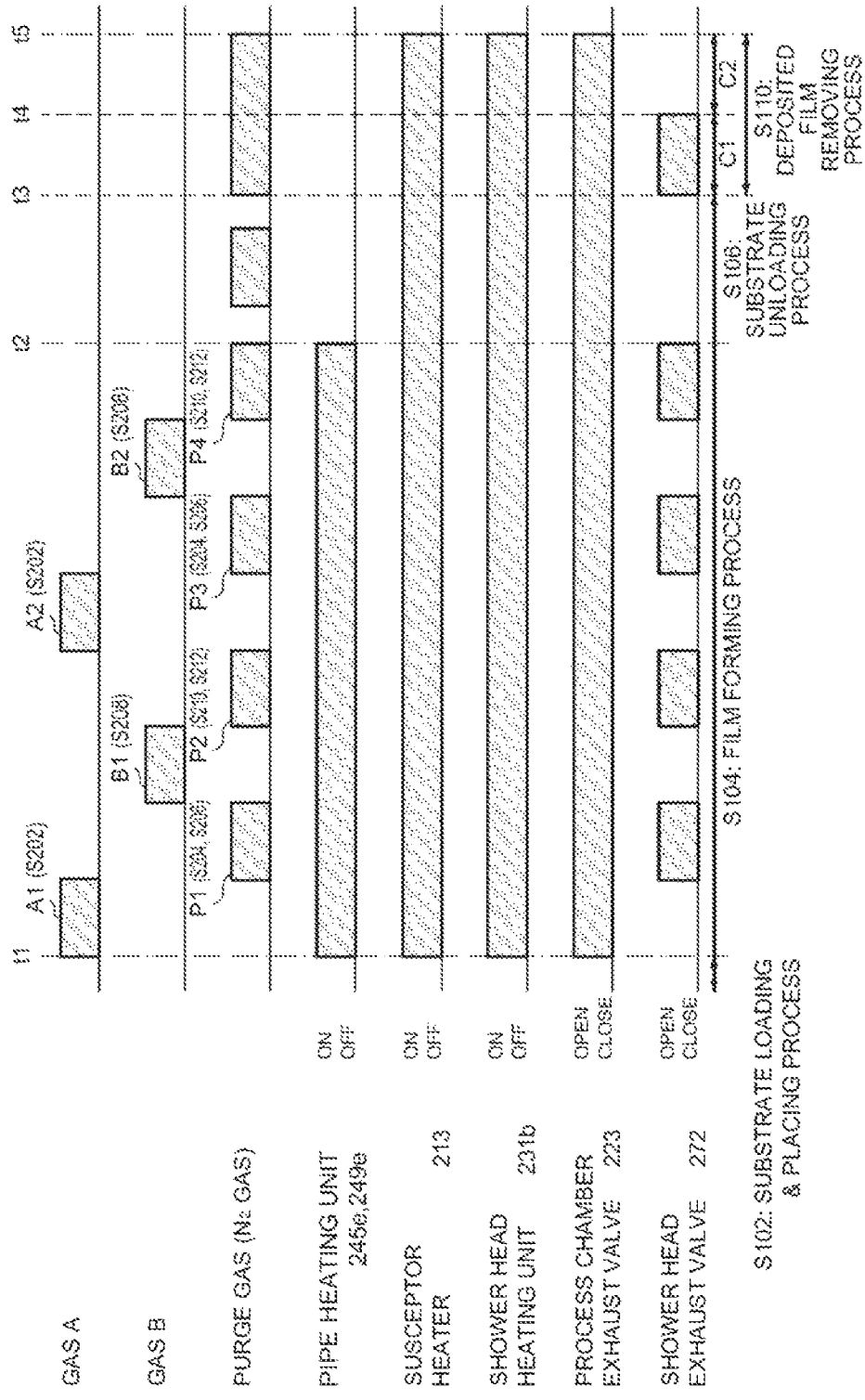
FIG. 4 is a sequence diagram of the substrate processing process according to the first embodiment of the present invention.

Next, the deposited film removing process (operation S110) will be described in detail with reference to FIG. 4. FIG. 4 is a sequence diagram of the substrate processing process according to the first embodiment of the present invention.

FIG. 4 illustrates the states of a gas A (a first processing gas, e.g., TiCl4 gas) and a gas B (a second processing gas, e.g., NH3 gas) supplied into the processing chamber 201, heating states of the pipe heating unit 245e of the third gas supply system 245 and the pipe heating unit 249e of the fourth gas supply system 249, a heating state of the substrate placing unit heater 213, a heating state of the resistance heater 231b, an open state of the pressure adjuster 223 of the first exhaust system 220, and an open/closed state of the valve 272 of the second exhaust system 270, in the film forming process (operation S104), the substrate unloading process (operation S106) and the deposited film removing process (operation S110).

Referring to FIG. 4, in the film forming process (operation S104) performed from a time point t1 to a time point t2, a process A1 of supplying the gas A, a process P1 of exhausting the gas A [the first shower head exhaust process (operation S204) and the first processing chamber exhaust process (operation S206)], a process B1 of supplying the gas B, a process P2 of exhausting the gas B [the second shower head exhaust process (operation S210) and the second processing chamber exhaust process (operation S212)], a process A2 of supplying the gas A, a process P3 of exhausting the gas A, a process B2 of supplying the gas B, and a process P4 of exhausting the gas B are sequentially performed. In addition, an inert gas such as N2 gas may be used as a carrier gas in the processes A1, A2, B1 and B2. Although FIG. 4 illustrates that the processes P1 to P4 in which a purge gas is supplied are discontinuously performed, these processes may be continuously performed.

As illustrated in FIG. 4, in the film forming process (operation S104), the pipe heating unit 245e of the third gas supply system 245, the pipe heating unit 249e of the fourth gas supply system 249, the substrate placing unit heater 213 and the resistance heater 231b are 'ON', that is, all of the pipe heating unit 245e of the third gas supply system 245, the pipe heating unit 249e of the fourth gas supply system 249, the substrate placing unit heater 213 and the resistance heater 231b are in operation. In addition, the degree of openness of the pressure adjuster 223 of the first exhaust system 220 is continuously open, i.e., exhausting is continuously performed using the first exhaust system 220. In addition, the valve 272 of the second exhaust system 270 is open only during the processes P1, P2, P3 and P4 in which the purge gas is supplied. In addition, as described above, in each of the processes P1, P2, P3 and P4, the valve 272 may be closed to prevent exhausting from being performed using the second exhaust system 270 while the first processing chamber exhaust process (operation S206) and the second processing chamber exhaust process (operation S212) are performed.

Next, in the substrate unloading process (operation S106) performed from the time point t2 to a time point t3, a processed wafer 200 is unloaded from the processing chamber 201. In the substrate unloading process (operation S106), although exhausting is performed using the first exhaust system 220, exhausting is not performed using the second exhaust system 270. In addition, a purge gas is supplied into the processing chamber 201 using the third gas supply system 245. In addition, the pipe heating unit 245e of the third gas supply system 245 and the pipe heating unit 249e of the fourth gas supply system 249 are 'OFF', i.e., all operations of thereof are suspended, but both the substrate placing unit heater 213 and the resistance heater 231b are 'ON', i.e., they are operated to perform heating.

Next, in the deposited film removing process (operation S110) performed from the time point t3 to a time point t5, a deposited film attached to an inner wall of the buffer chamber 232 or the dispersion plate 234 is removed. In detail, a first step C1 of the deposited film removing process (operation S110) is performed at the time points t3 and t4, and a second step C2 of the deposited film removing process (operation S110) is performed at the time points t4 and t5.

For example, in the first step C1, a pressure in the processing chamber 201 is in a range of about 2,050 Pa to 2,100 Pa and a pressure in the buffer chamber 232 is about 2,000 Pa. In the second step C2, a pressure in the processing chamber 201 is about 500 Pa and a pressure in the buffer chamber 232 is about 2,000 Pa. As described above, the pressure in the processing chamber 201 is higher than that in the buffer chamber 232 in the first step C1, and the pressure in the buffer chamber 232 is higher than that in the processing chamber 201 in the second step C2.

In the deposited film removing process (operation S110), exhausting is performed using the first exhaust system 220 and the second exhaust system 270. In addition, a purge gas is supplied into the buffer chamber 232 or the processing chamber 201 using the third gas supply system 245 and the fourth gas supply system 249. In addition, both the substrate placing unit heater 213 and the resistance heater 231b are 'ON'. In addition, both the pipe heating unit 245e of the third gas supply system 245 and the pipe heating unit 249e of the fourth gas supply system 249 are 'OFF'.

In the first step C1, the pipe heating unit 245e of the third gas supply system 245 and the pipe heating unit 249e of the fourth gas supply system 249 are set to be 'OFF' to prevent a purge gas from being heated using the third gas supply system 245 and the fourth gas supply system 249. That is, the temperature of the purge gas in the deposited film removing process (operation S110) is set to be lower than that of the purge gas in the film forming process (operation S104). For example, the temperature of the purge gas is in a range of 10° C. to 300° C. (preferably, 280° C.) in the deposited film removing process (operation S110) and is in a range of 300° C. to 500° C. (preferably, 380° C.) in the film forming process (operation S104). In this case, the resistance heater 231b is set to be 'ON' to heat inner walls of the buffer chamber 232 or the dispersion plate 234 as described above.

Thus, a crack may occur in a deposited film attached to an inner wall of the buffer chamber 232 or the dispersion plate 234 due to heat stress caused by the difference between the temperatures of the purge gas supplied into the buffer chamber 232 and either the inner walls of the buffer chamber 232 or the dispersion plate 234, thereby enabling the deposited film to be easily separated from the inner wall of the buffer chamber 232 or the dispersion plate 234.

A coefficient of thermal expansion of the inner walls of the buffer chamber 232 or the dispersion plate 234 and a coefficient of thermal expansion of the deposited film vary according to time. Thus, stress occurs in a deposited film, which is attached to the inner walls of the buffer chamber 232 or the dispersion plate 234 in a film forming process, at a temperature which is less than a temperature in the film forming process, due to the difference between the coefficients of thermal expansion of the deposited film. In the present embodiment, the deposited film may be easily separated by setting the temperature of the purge gas to be lower than when the film is formed and heating the inner walls of the buffer chamber 232 or the dispersion plate 234 to increase the difference between the temperatures of either the inner walls of the buffer chamber 232 or the dispersion plate 234 and the purge gas that is at a low temperature.

Also, in the first step C1, the valve 272 which is a shower head exhaust valve and the pressure adjuster 223 which is a processing chamber exhaust valve are opened to perform exhausting using the first exhaust system 220 and the second exhaust system 270. In this case, the pressure adjuster 273 of the second exhaust system 270 or the pressure adjuster 223 of the first exhaust system 220 is controlled such that a flow rate (exhaust flow rate) of a purge gas to be exhausted by the second exhaust system 270 is higher than that of a purge gas to be exhausted by the first exhaust system 220.

Thus, a film separated from an inner wall of the buffer chamber 232 or the dispersion plate 234 may be suppressed from being supplied to the through-holes 234a of the dispersion plate 234. Thus, the through-holes 234a may be suppressed from being blocked by the separated film. In addition, a deposited film blocking the through-holes 234a of the dispersion plate 234 may be easily removed and discharged using the second exhaust system 270. In addition, a film or particle separated from an inner wall of the processing chamber 201 may be discharged from the processing chamber 201 by performing exhausting using the first exhaust system 220.

The pressure adjuster 273 of the second exhaust system 270 or the pressure adjuster 223 is preferably controlled such that an exhaust conductance in the buffer chamber 232 using the second exhaust system 270 is higher than an exhaust conductance in the buffer chamber 232 using the first exhaust system 220 using the processing chamber 201. Thus, an inside atmosphere of the processing chamber 201 may flow into the buffer chamber 232 without causing an inside atmosphere of the buffer chamber 232 to flow into the processing chamber 201.

Accordingly, a film separated from an inner wall of the buffer chamber 232 or the dispersion plate 234 may be discharged using the second exhaust system 270. After a time sufficient to allow most of the film separated from an inner wall of the buffer chamber 232 or the dispersion plate 234 to be discharged using the second exhaust system 270 has elapsed, the valve 22 which is a shower head exhaust valve is closed to end the first step first C1 and to start the second step C2.

Also, in the first step C1, exhaust process performed using the first exhaust system 220 may be suspended. In this case, a film or particle separated from an inner wall of the processing chamber 201 cannot be discharged from the processing chamber 201 but a film separated from the buffer chamber 232 or the dispersion plate 234 may be discharged using the second exhaust system 270.

In the second step C2, since exhausting is prevented from being performed using the second exhaust system 270, a flow of a purge gas supplied using the third gas supply system 245 is formed in a direction from the buffer chamber 232 to the processing chamber 201. In addition, a flow of a purge gas supplied using the fourth gas supply system 249 is not formed in a direction from the processing chamber 201 to the buffer chamber 232.

The purge gas supplied using the third gas supply system 245 is compressively discharged through the through-holes 234a while removing a deposit attached into the through-holes 234a to pass through the through-holes 234a of the dispersion plate 234. The compressively discharged deposit is discharged using the first exhaust system 220.

Also, as described above, the substrate placing unit heater 213 (susceptor heater) is preferably set to be 'ON' in the second step C2. By setting the substrate placing unit heater 213 (susceptor heater) to be 'ON', the dispersion plate 234 may be highly heated. Therefore, the purge gas, the deposited film, the dispersion plate 234 and the substrate placing unit 210 may be listed in a descending order according to temperature, i.e., the temperature of the purge gas is the lowest and the temperature of the substrate placing unit 210 is the highest. Thus, the difference between the temperatures of the dispersion plate 234 and the purge gas, i.e., the difference between the temperatures of a deposited film attached to the dispersion plate 234 and the purge gas, may increase greatly. That is, higher heat stress may be applied to the deposited film. Accordingly, the deposited film may be more easily separated from the dispersion plate 234.

In both of or one of the first and second steps C1 and C2, a flow rate of a purge gas may be increased in the film forming process (operation S104) by adjusting a flow rate of a purge gas, which is supplied using the third gas supply system 245 or the fourth gas supply system 249, by the MFC 245c or 249c.

Thus, a higher flow rate of the purge gas may collide against an inner wall of the buffer chamber 232 or the dispersion plate 234 than in the film forming process (operation S104), thereby easily removing the deposited film attached to the inner wall of the buffer chamber 232 or the dispersion plate 234.

Also, in both of or one of the first and second steps C1 and C2, the substrate placing unit heater 213 which is a susceptor heater or the resistance heater 231b may be 'OFF'. Even if the substrate placing unit heater 213 or the resistance heater 231b is 'OFF', the temperature of the purge gas is lower than in the film forming process (operation S104) and thus a film attached to an inner wall of the buffer chamber 232 or the dispersion plate 234 may be removed to a certain extent.

Also, although the pipe heating units 245e and 249e configured to heat a purge gas are installed in the third gas supply system 245 and the fourth gas supply system 249 in the previous embodiment, respectively, a pipe adjustment unit having a heating function and a cooling function and configured to adjust the temperature of a purge gas may be installed instead of the pipe heating units 245e and 249e. In this case, the temperature of a purge gas may be easily controlled to be equal to a desired temperature in the deposited film removing process (operation S110).

(4) Effects of the First Embodiment

According to the first embodiment, at least one of the following effects may be achieved.

(A1) In a deposited film removing process, an inert gas, the temperature of which is lower than a purge gas (inert gas) supplied in a film forming process is supplied into a shower head, and thus a deposited film attached to a gas guide, etc. installed in the shower head may be cooled. In addition, higher heat stress may be applied to a deposited film attached into the shower head than when a cooling unit is installed outside. That is, the deposited film may be easily removed from the shower head.

(A2) Since an inert gas, the temperature of which is lower than a purge gas (inert gas) supplied in the film forming process is supplied into a processing chamber in the deposited film removing process, a deposited film attached to a member, such as the partition plate 204, which is exposed in the processing chamber may be directly cooled and high heat stress may be applied to the deposited film. That is, a deposited film may be easily removed from the processing chamber.

(A3) In this case, since the inside of the shower head (an inner wall of the shower head or a dispersion plate) is heated, a deposited film may be very easily removed from the shower head.

(A4) The deposited film removing process is configured to perform a first exhaust process of exhausting an inside atmosphere of the shower head using a second exhaust system installed in the shower head and a second exhaust process of exhausting an inside atmosphere of the processing chamber using a first exhaust system installed in the processing chamber after the first exhaust process. Thus, a deposited film may be very easily removed from the shower head.

(A5) In the first exhaust process, an exhaust flow rate of the second exhaust system is set to be higher than that of the first exhaust system and thus a deposited film attached into the shower head may be suppressed from being separated and supplied into the processing chamber.

(A6) In the first exhaust process, an inside atmosphere of the processing chamber is set to flow into the shower head and thus a deposited film attached to the shower head may be more reliably suppressed from being separated from the shower head and supplied into the processing chamber.

(A7) In the second exhaust process, an exhaust flow rate of the first exhaust system is set to be higher than that of the second exhaust system and thus particles present in the shower head may be easily discharged from the shower head.

(A8) In the second exhaust process, an inside atmosphere of the shower head is set to flow into the processing chamber and thus particles (e.g., particles generated from a deposited film attached into the shower head) present in the processing chamber may be more reliably suppressed from being separated from the shower head and supplied into the processing chamber.

(A9) In a purge process included in the film forming process, a purge gas (inert gas) supplied into the shower head is heated by a gas heating unit. In the deposited film removing process, a purge gas (inert gas) is supplied into the shower head while heating performed by the gas heating unit is suspended. Thus, a deposited film may be easily removed from the shower head. In addition, since the temperature of the shower head in the film forming process may be easily maintained to be in a range of a process window, a high-quality film may be formed.

(A10) In the deposited film removing process, a flow rate of a purge gas (inert gas) supplied into the shower head is higher than in the purge process included in the film forming process, and thus a deposited film may be easily removed from the shower head.

(A11) In the first exhaust process, a purge gas (inert gas) is supplied into the processing chamber using a purge gas supply system (a fourth gas supply system) installed in the processing chamber and thus a deposited film may be more easily removed from the shower head.

Second Embodiment

Figure 5:
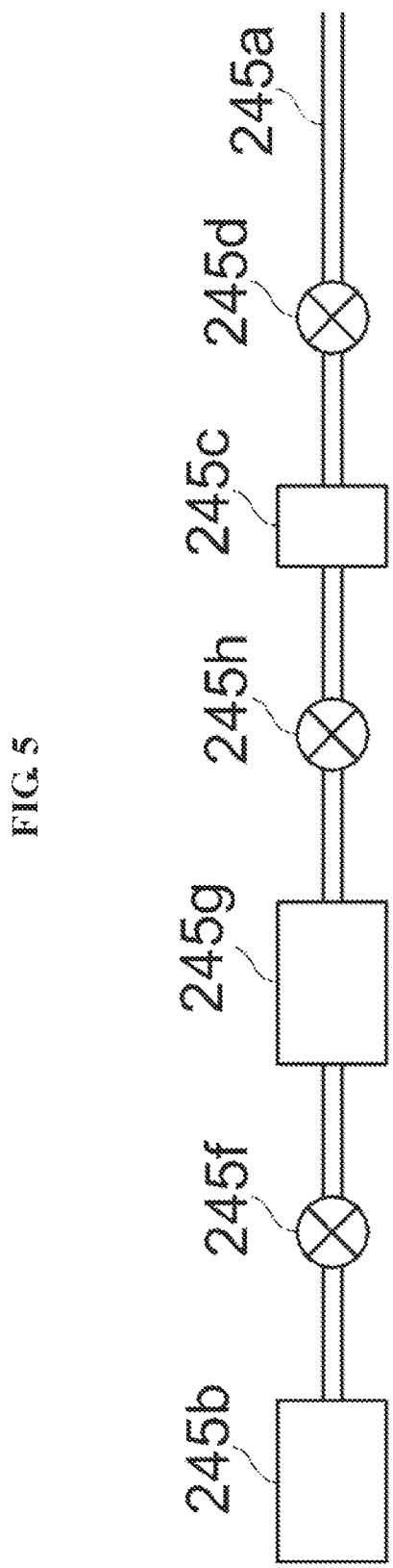
FIG. 5 is a sequence diagram of a third gas supply system according to a second embodiment of the present invention.
Figure 6:
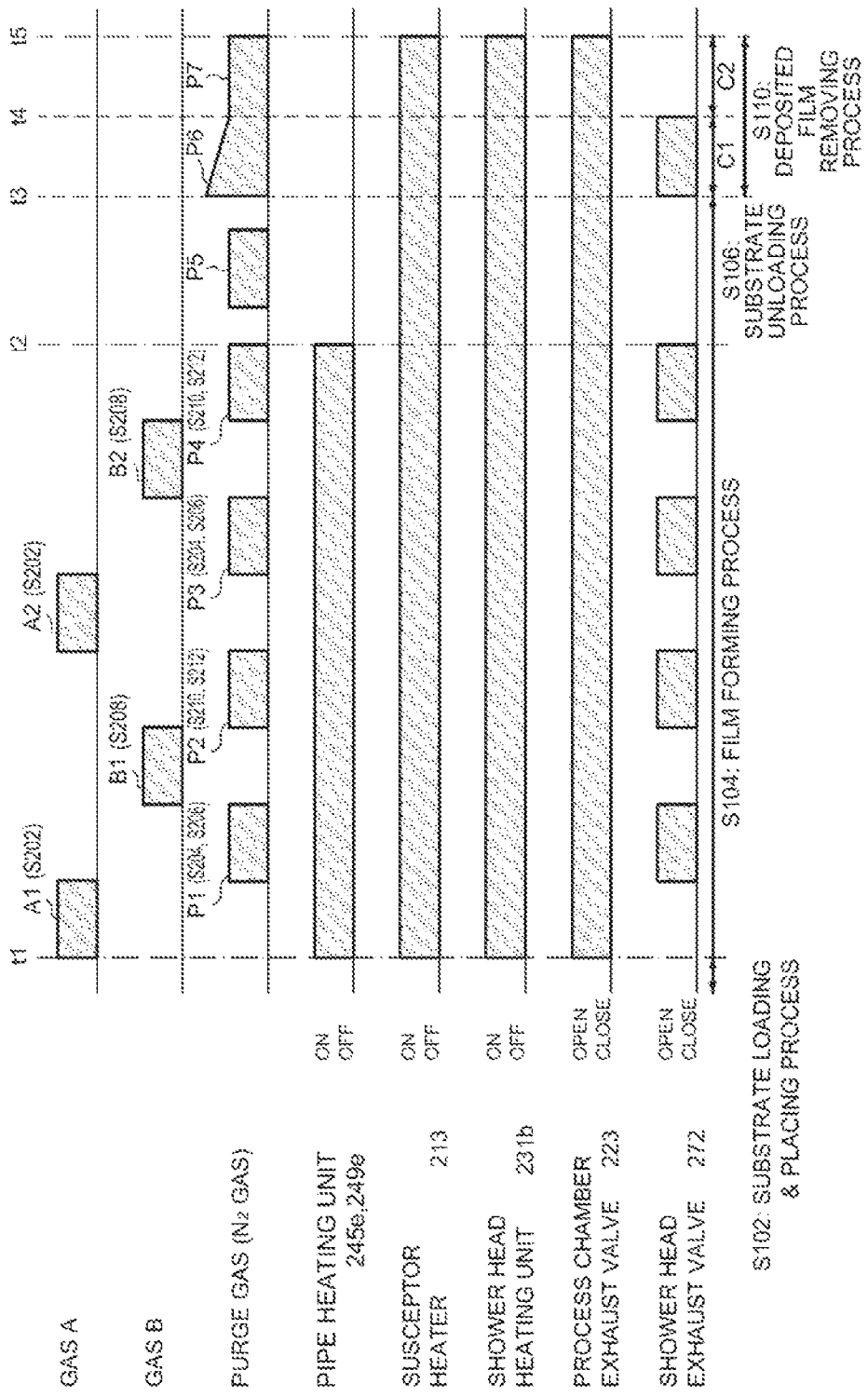
FIG. 6 is a sequence diagram of a substrate processing process according to the second embodiment of the present invention.

A second embodiment of the present invention will be described with reference to FIGS. 5 and 6. FIG. 5 is a sequence diagram of a third gas supply system according to a second embodiment of the present invention. FIG. 6 is a sequence diagram of a substrate processing process according to the second embodiment of the present invention.

A substrate processing apparatus according to the second embodiment is substantially the same as the substrate processing apparatus according to the first embodiment except for a third gas supply system and a controller configured to control the third gas supply system illustrated in FIG. 5.

Referring to FIG. 5, the third gas supply system according to the second embodiment further includes a valve 245*f* which is an opening/closing valve, a tank 245*g* which is a gas storage unit configured to store a gas, and a valve 245*h* which is an opening/closing valve installed between a third gas supply source 245*b* and an MFC 245*c*, compared to the third gas supply system 245 according to the first embodiment.

An operation of the third gas supply system according to the second embodiment will be described with reference to FIG. 6 below. The second embodiment of FIG. 6 is substantially the first embodiment of FIG. 4 except for a flow rate of a purge gas at a time point t3 to a time point t4 and a method of supplying a purge gas.

Referring to a process P6 of FIG. 6, in the second embodiment, a purge gas that is not heated is supplied into the buffer chamber 232 or the processing chamber 201 using the third gas supply system 245 and the fourth gas supply system 249 in a first step C1 of a deposited film removing process (operation S110), similar to the first embodiment. In this case, a purge gas stored in the tank 245*g* of third gas supply system 245 is supplied into the buffer chamber 232 at once by opening the valve 245*d* and the valve 245*h* at the time point t3. The capacity of the tank 245*g* is set such that an initial flow rate of the purge gas (a flow rate of the purge gas when the supply of the purge gas begins) supplied into the buffer chamber 232 is higher than the flow rate of a purge gas in the first embodiment.

Referring to the process P6 of FIG. 6, the flow rate of the purge gas supplied into the buffer chamber 232 is high when the supply of the purge gas begins but gradually decreases to be equal to the flow rate of the purge gas supplied into the buffer chamber 232 in the first embodiment. In addition, the form of the process P6 of FIG. 6 roughly denotes the flow rate of the purge gas.

As described above, an initial flow rate of the purge gas supplied into the shower head is set to be higher than when the supply of the purge gas ends, and the flow rate of the purge gas supplied into the shower head may be easily increased. In addition, a pressure of the purge gas colliding against an inner wall of the buffer chamber 232 or the dispersion plate 234 changes within a short time and the temperature of the inner wall of the buffer chamber 232 or the temperature of the dispersion plate 234 may be cooled to a large extent within a short time. Thus, a deposited film attached to the inner wall of the buffer chamber 232 or the dispersion plate 234 may be easily removed.

The purge gas is stored in the tank 245*g* after a process P5 performed at a time point t2 to a time point t3 ends and when the valve 245*f* is opened in a state in which the valve 245*d* and the valve 245*h* are closed. Thereafter, after a predetermined amount of the purge gas is stored in the tank 245*g*, the purge gas is supplied at once into the buffer chamber 232 from the tank 245*g* by opening the valve 245*d* and the valve 245*h* at the time point t3 of FIG. 6 as described above.

In a second step C2 according to the second embodiment, an operation of the third gas supply system is substantially the same as that of the third gas supply system 245 according to the first embodiment in the second step C2. In addition, in the film forming process (operation S104) according to the second embodiment, the third gas supply system is operated in a state in which the valve 245*f* and the valve 245*h* are continuously open. Thus, an operation of the third gas supply system according to the second embodiment is substantially the same as that of the film forming process (operation S104) according to the first embodiment.

Also, in the second embodiment, a fourth gas supply system may be also configured to include a tank so as to be operated similar to the third gas supply system.

According to the second embodiment, at least one of the following effects may be achieved.

(B1) A flow rate of a purge gas (inert gas) supplied into the shower head in the deposited film removing process is set to be higher than in the film forming process and thus a deposited film may be easily removed from the shower head.

(B2) In the deposited film removing process, a flow rate of a purge gas (inert gas) supplied into the shower head is set to be higher when the supply of the purge gas (inert gas) begins than when the supply of the purge gas (inert gas) ends. Thus, a deposited film may be easily removed from the shower head.

Third Embodiment

Figure 7:
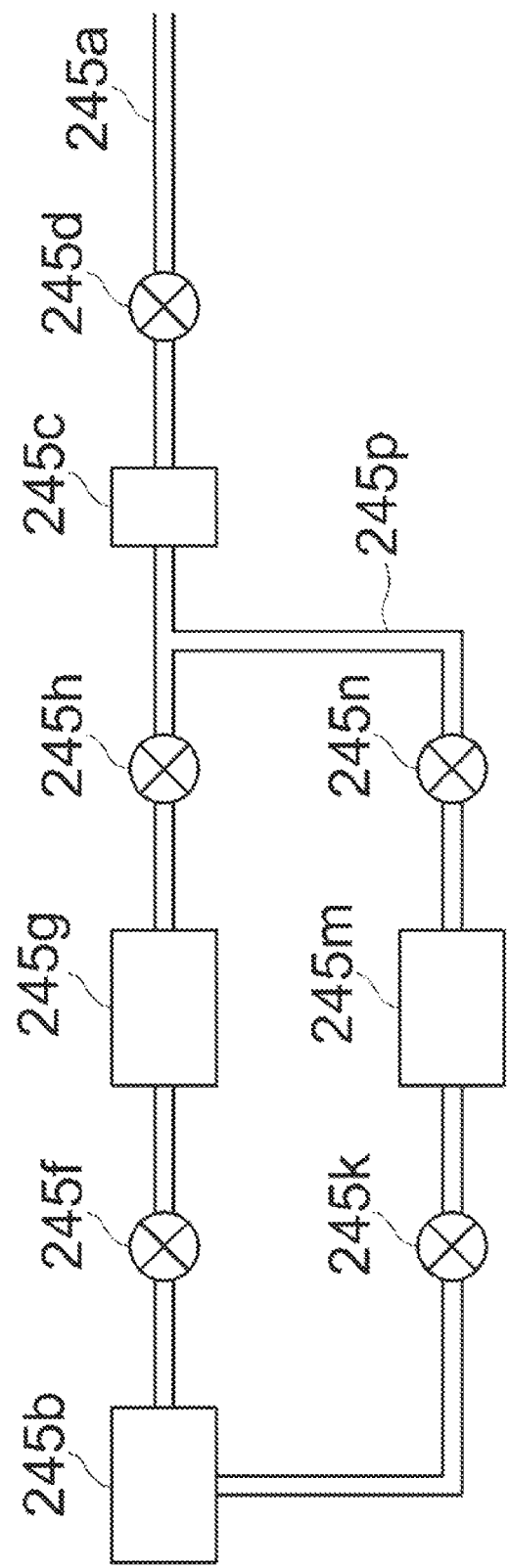
FIG. 7 is a sequence diagram of a third gas supply system according to a third embodiment of the present invention.
Figure 8:
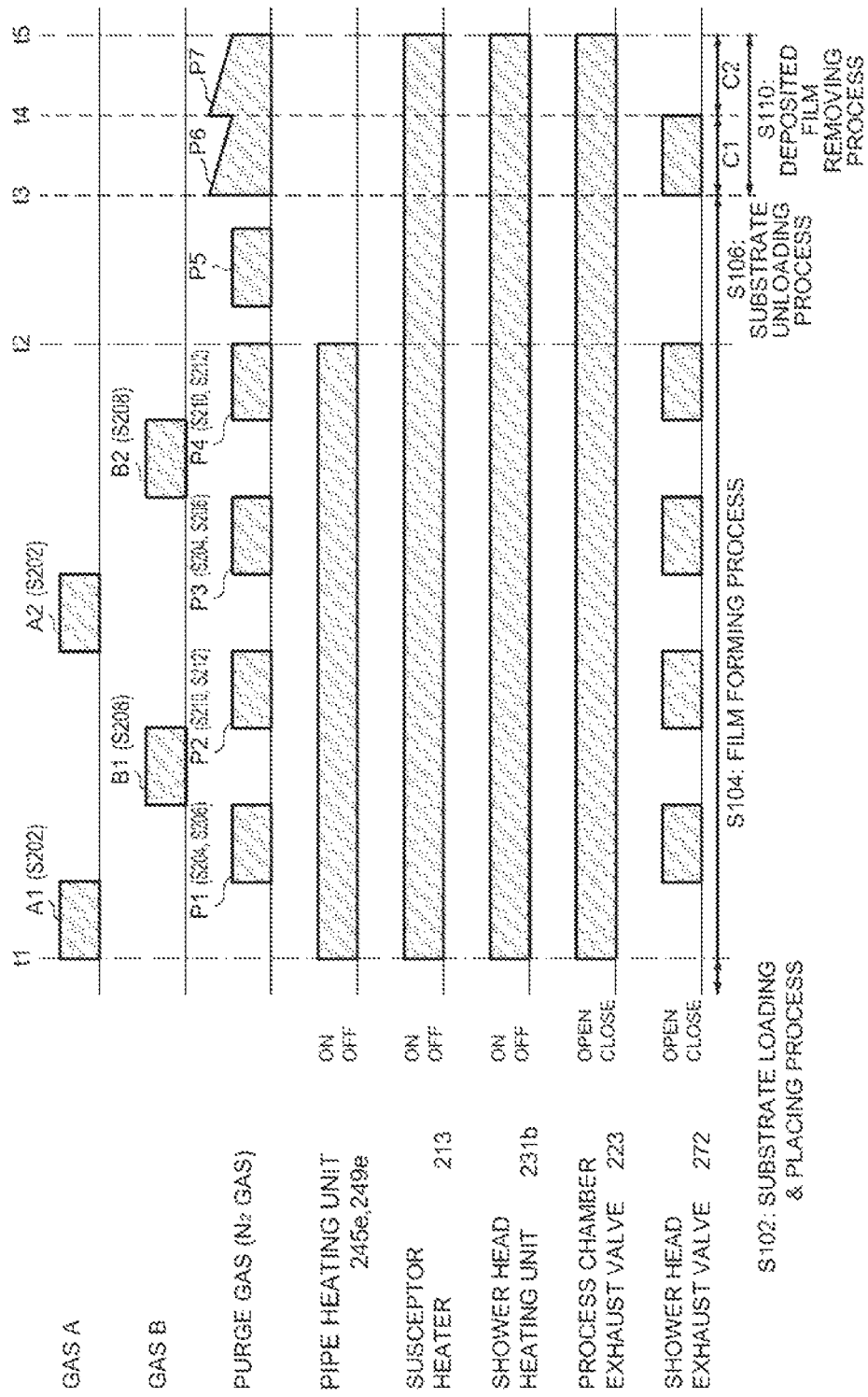
FIG. 8 is a sequence diagram of a substrate processing process according to the third embodiment of the present invention.

Next, a third embodiment of the present invention will be described with reference to FIGS. 7 and 8. FIG. 7 is a sequence diagram of a third gas supply system according to a third embodiment of the present invention. FIG. 8 is a sequence diagram of a substrate processing process according to the third embodiment of the present invention. A substrate processing apparatus according to the third embodiment is substantially the same as the substrate processing apparatus according to the first embodiment except for a third gas supply system and a controller configured to control the third gas supply system illustrated in FIG. 7.

Referring to FIG. 7, a first gas storage system and a second gas storage system are connected in parallel between a third gas supply source 245b and an MFC 245c in the third gas supply system according to the third embodiment, compared to the third gas supply system 245 according to the first embodiment. The first gas storage system is configured to include a valve 245f which is an opening/closing valve, a tank 245g configured to store a gas, and a valve 245h which is an opening/closing valve. The second gas storage system is installed at a gas branch pipe 245p branching off from a third gas supply pipe 245a, and configured to include a valve 245k which is an opening/closing valve, a tank 245m which is a gas storage unit configured to store a gas, and a valve 245n which is an opening/closing valve.

An operation of the third gas supply system according to the third embodiment will be described with reference to FIG. 8 below. The embodiment of FIG. 8 is substantially the same as the first embodiment of FIG. 4 except for a flow rate of a purge gas at a time point t3 to a time point t5 and a method of supplying the purge gas. In addition, an operation of third gas supply system according to the third embodiment at the time point t3 to the time point t4 (first step C1) is substantially the same as that of the third gas supply system according to the second embodiment at the time point t3 to the time point t4 (first step C1) and thus is not redundantly described here.

Referring to a process P7 of FIG. 8, in the third embodiment, in a second step C2 of a deposited film removing process (operation S110), a purge gas that is not heated by the third gas supply system 245 and the fourth gas supply system 249 is supplied into the buffer chamber 232 or the processing chamber 201. In this case, the purge gas stored in the tank 245m of the third gas supply system 245 is supplied into the buffer chamber 232 at once by opening the valve 245n at the time point t4. A method of supplying a gas as described above is referred to as a flush flow. The valve 245d is open beforehand during the process P6 of FIG. 8. In a process P7, the capacity of the tank 245m is set such that an initial flow rate of the purge gas supplied into the buffer chamber 232 is higher than the flow rate of the purge gas in the first embodiment.

Referring to the process P7 of FIG. 8, the flow rate of the purge gas supplied into the buffer chamber 232 in the process P7 is high when the supply of the purge gas begins but gradually decreases to be equal to the flow rate of the purge gas supplied into the buffer chamber 232 in the first embodiment. In addition, the form of the process P6 of FIG. 6 roughly denotes the flow rate of the purge gas. In addition, the form of the process P7 of FIG. 8 roughly denotes the flow rate of the purge gas.

The purge gas is stored in the tank 245m at the time point t4 when the valve 245k is opened in a state in which the valve 245n is closed. Thereafter, after a predetermined amount of the purge gas is stored in the tank 245m, the purge gas is supplied at once into the buffer chamber 232 from the tank 245m by opening the valve 245n and the valve 245h at the time point t4 of FIG. 8 as described above. After a predetermined time has elapsed and the process P7 (second step C2) has ended, the valve 245n is closed and the purge gas starts to be stored in purge gas tank 245m.

As described above, in the first step C1 of the third embodiment, an operation of the third gas supply system is substantially the same as that of the third gas supply system in the first step C1 of the second embodiment. In addition, in the film forming process (operation S104) of the third embodiment, the third gas supply system is operated in a state in which the valve 245f and the valve 245h are open, and is thus operated similar to the third gas supply system 245 in the film forming process (operation S104) of the first embodiment.

Also, in the third embodiment, a fourth gas supply system may be also configured to include a tank so as to be operated similar to the third gas supply system.

According to the third embodiment, at least one of the following effects may be achieved.

(C1) In each of a first exhaust process and a second exhaust process, the flow rate of a purge gas (inert gas) supplied into the shower head is higher when the supply of the purge gas (inert gas) begins than when the supply of the purge gas (inert gas) ends. Thus, a deposited film attached into the shower head and particles present in the processing chamber may be more easily discharged.

Other Embodiments of the Present Invention

Although exemplary embodiments of the present invention have been particularly described above, the present invention is not limited thereto and may be embodied in various forms without departing from the spirit and scope of the invention and various effects may be derived by embodying the present invention in various forms.

Although cases in which a titanium nitride (TiN) film is formed have been described above in the previous embodiments, the present invention is not limited thereto and is also applicable to forming a silicon oxide (SiO) film, a silicon nitride (SiN) film, a tungsten (W) film, etc.

Also, cases in which a film is formed by alternately supplying two types of processing gases to a substrate have been described above in the previous embodiments, the present invention is not limited thereto and is also applicable to forming a film by simultaneously supplying different pluralities of processing gases on a substrate. In addition, the present invention is also applicable to substrate processing other than a film forming process.

Also, in the previous embodiments, the wafer 200 is embodied as a round wafer but may be a rectangular substrate.

According to the one or more aspects of the present invention, a deposited film may be efficiently removed from the inside of a shower head, thereby suppressing generation of particles.

Supplementary Note 1

According to one aspect of the present invention, there is provided a method of manufacturing a semiconductor device, the method including: (a) forming a film on a substrate by supplying a film forming gas and an inert gas to the substrate in a processing chamber via a shower head; and (b) removing a deposited film deposited in the shower head in the step (a) by supplying an inert gas, which has a temperature lower than that of the inert gas supplied in the step (a), into the processing chamber without the substrate loaded in the processing chamber.

Supplementary Note 2

In the method of manufacturing a semiconductor device of Supplementary note 1, the step (a) includes exhausting an inside atmosphere of the processing chamber by a first exhaust system connected to the processing chamber, and the step (b) comprises: (b-1) exhausting an inside atmosphere of the shower head by a second exhaust system connected to the shower head; and (b-2) exhausting the inside atmosphere of the processing chamber by the first exhaust system after performing the step (b-1).

Supplementary Note 3

In the method of manufacturing a semiconductor device of Supplementary note 2, the inside atmosphere of the processing chamber flows into the shower head in the step (b-1).

Supplementary Note 4

In method of manufacturing a semiconductor device of Supplementary note 2 or 3, the inside atmosphere of the shower head flows into the processing chamber in the step (b-2).

Supplementary Note 5

In method of manufacturing a semiconductor device of any one of Supplementary notes 1 to 4, an exhaust flow rate of the second exhaust system is greater than that of the first exhaust system in the step (b-1).

Supplementary Note 6

In method of manufacturing a semiconductor device of any one of Supplementary notes 1 to 5, an exhaust flow rate of the first exhaust system is greater than that of the second exhaust system in the step (b-2).

Supplementary Note 7

In method of manufacturing a semiconductor device of any one of Supplementary notes 1 to 6, the inert gas is supplied by an inert gas supply system connected to the shower head and including a gas heating unit, and the inert gas supplied into the shower head in the step (a) via the inert gas supply system is heated by the gas heating unit.

Supplementary Note 8

In the substrate processing apparatus of any one of Supplementary notes 1 to 7, the inert gas is supplied into the shower head via the inert gas supply system with heating by the gas heating unit being suspended in the step (b).

Supplementary Note 9

In the substrate processing apparatus of any one of Supplementary notes 1 to 8, a flow rate of the inert gas supplied into the shower head via the inert gas supply system in the step (b) is greater than that of the inert gas supplied into the shower head via the inert gas supply system in the step (a).

Supplementary Note 10

In the substrate processing apparatus of any one of Supplementary notes 1 to 9, a flow rate of the inert gas supplied into the shower head via the inert gas supply system in the step (b) is greater at the beginning of supply than at the end of supply.

Supplementary Note 11

In the substrate processing apparatus of any one of Supplementary notes 1 to 10, an inside of the shower head is heated in the step (b).

Supplementary Note 12

In the substrate processing apparatus of any one of Supplementary notes 2 to 11, the inert gas is supplied into the processing chamber via a second inert gas supply system connected to the processing chamber in the step (b-1).

Supplementary Note 13

According to another aspect of the present invention, there is provided a method of processing a substrate including: (a) forming a film on a substrate by supplying a film forming gas and an inert gas to the substrate in a processing chamber via a shower head; and (b) removing a deposited film deposited in the shower head in the step (a) by supplying an inert gas, which has a temperature lower than that of the inert gas supplied in the step (a), into the processing chamber without the substrate loaded in the processing chamber.

Supplementary Note 14

According to another aspect of the present invention, there is provided a program causing a computer to perform: (a) forming a film on a substrate by supplying a film forming gas and an inert gas to the substrate in a processing chamber via a shower head; and (b) removing a deposited film in the shower head in the step (a) by supplying an inert gas having a temperature lower than that of the inert gas supplied in the step (a), into the processing chamber without the substrate loaded in the processing chamber.

Supplementary Note 15

According to another aspect of the present invention, there is provided a non-transitory computer readable recording medium causing a computer to perform: (a) forming a film on a substrate by supplying a film forming gas and an inert gas to the substrate in a processing chamber via a shower head; and (b) removing a deposited film in the shower head in the step (a) by supplying an inert gas having a temperature lower than that of the inert gas supplied in the step (a), into the processing chamber without the substrate loaded in the processing chamber.

Supplementary Note 16

According to another aspect of the present invention, there is provided a method of manufacturing a substrate, the method including: (a) forming a film on the substrate by supplying a film forming gas and an inert gas to the substrate in a processing chamber via a shower head; and (b) removing a deposited film in the shower head in the step (a) by supplying an inert gas having a temperature lower than that of the inert gas supplied in the step (a) without the substrate loaded in the processing chamber.

Supplementary Note 17

According to another aspect of the present invention, there is provided a substrate processing apparatus including: a processing chamber connected to a shower head and configured to process a substrate; a film forming gas supply system connected to the shower head and configured to supply a film forming gas into the processing chamber via the shower head; an inert gas supply system connected to the shower head and configured to supply an inert gas into the processing chamber via the shower head; a controller configured to control the film forming gas supply system and the inert gas supply system to perform: (a) forming a film on the substrate by supplying the film forming gas and the inert gas to the substrate in the processing chamber via the shower head; and (b) removing a deposited film deposited in the shower head in the step (a) by supplying an inert gas, which has a temperature lower than that of the inert gas supplied in the step (a), into the shower head without the substrate loaded in the processing chamber.

Supplementary Note 18

The substrate processing apparatus of Supplementary note 17, further including: a first exhaust system connected to the processing chamber; and a second exhaust system connected to the shower head, and wherein the controller is configured to perform: exhausting an inside atmosphere of the processing chamber by the first exhaust system in the step (a); (b-1) exhausting an inside atmosphere of the shower head by the second exhaust system; and (b-2) exhausting the inside atmosphere of the processing chamber by the first exhaust system after performing the step (b-1) in the step (b).

Supplementary Note 19

According to another aspect of the present invention, there is provided a substrate processing apparatus including: a processing chamber including a shower head and configured to process a substrate; a film forming gas supply system connected to the shower head and configured to alternately supply a first film forming gas and a second film forming gas into the processing chamber via the shower head; an inert gas supply system connected to the shower head and configured to supply an inert gas into the processing chamber via the shower head; a pipe heating unit installed in the inert gas supply system and configured to heat an inert gas supply pipe; and a controller configured to control the film forming gas supply system, the inert gas supply system, the pipe heating unit and a shower head heating unit to perform: (a) forming a film on the substrate by supplying the first film forming gas into the processing chamber from the film forming gas supply system via the shower head while the pipe heating unit is on, supplying the inert gas into the processing chamber from the inert gas supply system via the shower head, supplying the second film forming gas into the processing chamber from the film forming gas supply system via the shower head, and supplying the inert gas into the processing chamber from the inert gas supply system via the shower head, and (b) removing a deposited film deposited in the shower head in the step (a) by supplying an inert gas having a temperature lower than that of the inert gas supplied in the step (a) without the substrate loaded in the processing chamber while the pipe heating unit is off.

Supplementary Note 20

The substrate processing apparatus of Supplementary note 19, further including a first exhaust system installed in the processing chamber and a second exhaust system installed in the shower head, and wherein the controller is configured to perform exhausting an inside atmosphere of the processing chamber using the first exhaust system in the step (a), and to perform (b-1) exhausting an inside atmosphere of the shower head using the second exhaust system and an inside atmosphere of the processing chamber using the first exhaust system and (b-2) exhausting the inside atmosphere of the processing chamber using the first exhaust system after the step (b-1), in the step (b).

Supplementary Note 21

According to another aspect of the present invention, there is provided a method of manufacturing a semiconductor device, the method including: (a) forming a film on a substrate by supplying a film forming gas into the substrate via a shower head; (b) purging the inside of the shower head and the inside of the processing chamber by supplying an inert gas to purge the film forming gas supplied in the step (a); and (c) removing a deposited film attached to inner walls of the shower head and the processing chamber in the step (a) by supplying to the deposited film an inert gas, the temperature of which is lower than a temperature of the deposited film.

What is claimed is:

1. A method of manufacturing a semiconductor device, comprising:
   (a) supplying a film forming gas and an inert gas to a substrate in a processing chamber via a shower head; and
   (b) removing a deposited film deposited in the shower head in (a) by: supplying an inert gas having a temperature lower than a temperature of the shower head into the shower head without the substrate loaded in the processing chamber; and directly cooling the deposited film to generate a difference between the temperature of the shower head and a temperature of the deposited film.

2. The method of claim 1, wherein (a) comprises exhausting an inside atmosphere of the processing chamber by a first exhaust system connected to the processing chamber, and (b) comprises:
   (b-1) exhausting an inside atmosphere of the shower head by a second exhaust system connected to the shower head; and
   (b-2) exhausting the inside atmosphere of the processing chamber by the first exhaust system after performing (b-1).

3. The method of claim 2, wherein the inside atmosphere of the processing chamber flows into the shower head in (b-1).

4. The method of claim 2, wherein the inside atmosphere of the shower head flows into the processing chamber in (b-2).

5. The method of claim 2, wherein an exhaust flow rate of the second exhaust system is greater than that of the first exhaust system in (b-1).

6. The method of claim 2, wherein an exhaust flow rate of the first exhaust system is greater than that of the second exhaust system in (b-2).

7. The method of claim 2, wherein an inside pressure of the shower head is lower than that of the processing chamber in (b-1).

8. The method of claim 7, wherein the inside pressure of the shower head is higher than that of the processing chamber in (b-2).

9. The method of claim 1, wherein the inert gas is supplied by an inert gas supply system connected to the shower head and including a gas heating unit, and
   the inert gas supplied into the shower head in (a) via the inert gas supply system is heated by the gas heating unit.

10. The method of claim 9, wherein the inert gas is supplied into the shower head via the inert gas supply system with heating by the gas heating unit being suspended in (b).

11. The method of claim 9, wherein a flow rate of the inert gas supplied into the shower head via the inert gas supply system in (b) is greater than that of the inert gas supplied to the shower head via the inert gas supply system in (a).

12. The method of claim 9, wherein a flow rate of the inert gas supplied into the shower head via the inert gas supply system in (b) is greater at the beginning of supply than at the end of supply.

13. The method of claim 9, wherein the inert gas is supplied into the processing chamber via a second inert gas supply system connected to the processing chamber in (b-1).

14. The method of claim 1, wherein an inside of the shower head is heated in (b).

15. The method of claim 1, wherein the temperature of the inert gas supplied in (b) is lower than that of the inert gas supplied in (a).

16. The method of claim 1, wherein the inert gas is supplied directly into the shower head in (b).

17. The method of claim 1, further comprising: (c) removing a deposited film deposited in the processing chamber by supplying an inert gas having a temperature lower than a temperature of the processing chamber into the shower head.

18. The method of claim 17, wherein the inert gas having the temperature lower than the temperature of the shower head is supplied by a first inert gas supply system connected to the shower head in (b), and the inert gas having the temperature lower than the temperature of the processing chamber is supplied by a second inert gas supply system connected to the processing chamber in (c).

19. The method of claim 1, wherein a difference between temperatures of the shower head and the inert gas supplied in (b) is greater than a difference between temperatures of the shower head and the inert gas supplied in (a).

20. A method of manufacturing a semiconductor device, comprising:
   (a) supplying a film forming gas and an inert gas to the substrate in a processing chamber via a shower head; and
   (b) removing a deposited film deposited in the shower head in (a) by: supplying an inert gas having a temperature lower than a temperature of the shower head into the shower head without the substrate loaded in the processing chamber; and directly cooling the deposited film to generate a difference between the temperature of the shower head and a temperature of the deposited film,
   wherein a difference between temperatures of the shower head and the inert gas supplied in (b) is greater than a difference between temperatures of the shower head and the inert gas supplied in (a).

* * * * *